United States Patent
Lee et al.

(10) Patent No.: US 11,985,910 B2
(45) Date of Patent: May 14, 2024

(54) MEMRISTOR AND NEUROMORPHIC DEVICE COMPRISING THE SAME

(71) Applicants: Samsung Electronics Co., Ltd., Suwon-si (KR); President and Fellows Of Harvard College, Cambridge, MA (US)

(72) Inventors: Minhyun Lee, Suwon-si (KR); Dovran Amanov, Cambridge, MA (US); Renjing Xu, Cambridge, MA (US); Houk Jang, Cambridge, MA (US); Haeryong Kim, Seongnam-si (KR); Hyeonjin Shin, Suwon-si (KR); Yeonchoo Cho, Seongnam-si (KR); Donhee Ham, Cambridge, MA (US)

(73) Assignee: Samsung Electronics Co., Ltd., Gyeonggi-do (KR)

(*) Notice: Subject to any disclaimer, the term of this patent is extended or adjusted under 35 U.S.C. 154(b) by 74 days.

(21) Appl. No.: 17/836,435

(22) Filed: Jun. 9, 2022

(65) Prior Publication Data
US 2022/0320425 A1 Oct. 6, 2022

Related U.S. Application Data

(63) Continuation of application No. 16/823,865, filed on Mar. 19, 2020, now Pat. No. 11,374,171.
(Continued)

(30) Foreign Application Priority Data

Sep. 10, 2019 (KR) .................. 10-2019-0112371

(51) Int. Cl.
*H10N 70/00* (2023.01)
*H10B 63/00* (2023.01)
*H10N 70/20* (2023.01)

(52) U.S. Cl.
CPC .......... *H10N 70/826* (2023.02); *H10B 63/80* (2023.02); *H10N 70/24* (2023.02); *H10N 70/8416* (2023.02)

(58) Field of Classification Search
CPC .. H10N 70/826; H10N 70/24; H10N 70/8416; H10B 63/80
See application file for complete search history.

(56) References Cited

U.S. PATENT DOCUMENTS

| | | | |
|---|---|---|---|
| 7,557,385 B2 | 7/2009 | Katoda | |
| 8,891,284 B2 | 11/2014 | Williams et al. | |

(Continued)

FOREIGN PATENT DOCUMENTS

| | | |
|---|---|---|
| CN | 107408222 A | 11/2017 |
| JP | 2006-202872 A | 8/2006 |

(Continued)

OTHER PUBLICATIONS

Liqian Wu et al., Flexible, multilevel, and low-operating-voltage resistive memory based on MoS2-rGO hybrid, Applied Surface Science 463 (2019) 947-952 (Year: 2018).*

(Continued)

*Primary Examiner* — Shih Tsun A Chou
(74) *Attorney, Agent, or Firm* — HARNESS, DICKEY & PIERCE, P.L.C.

(57) ABSTRACT

Provided are memristors and neuromorphic devices including the memristors. A memristor includes a lower electrode and an upper electrode that are apart from each other and first and second two-dimensional material layers that are arranged between the lower electrode and the upper electrode and stacked without a chemical bond therebetween.

21 Claims, 16 Drawing Sheets

Related U.S. Application Data

(60) Provisional application No. 62/862,172, filed on Jun. 17, 2019.

(56) References Cited

U.S. PATENT DOCUMENTS

| | | | |
|---|---|---|---|
| 8,921,214 | B2 | 12/2014 | Lee et al. |
| 9,070,478 | B2 | 6/2015 | Cho et al. |
| 9,082,533 | B2 | 7/2015 | Yang et al. |
| 9,190,614 | B2 | 11/2015 | Aiga et al. |
| 9,831,427 | B1 | 11/2017 | Haase |
| 10,026,896 | B2 | 7/2018 | Jackson et al. |
| 2008/0079029 | A1 | 4/2008 | Williams |
| 2009/0039336 | A1 | 2/2009 | Terao et al. |
| 2009/0272962 | A1 | 11/2009 | Kumar et al. |
| 2012/0280224 | A1 | 11/2012 | Doolittle et al. |
| 2016/0043312 | A1 | 2/2016 | Yang et al. |
| 2016/0267378 | A1 | 9/2016 | Eleftheriou et al. |
| 2017/0228345 | A1 | 8/2017 | Gupta et al. |
| 2017/0320234 | A1 | 11/2017 | Cross et al. |
| 2018/0151583 | A1 | 5/2018 | Lupino et al. |
| 2018/0358470 | A1 | 12/2018 | Lee et al. |
| 2020/0083037 | A1* | 3/2020 | Park .................. H01L 21/02568 |
| 2020/0161432 | A1 | 5/2020 | Heo et al. |

FOREIGN PATENT DOCUMENTS

| | | |
|---|---|---|
| JP | 2009-043905 A | 2/2009 |
| JP | 2014-049660 A | 3/2014 |
| JP | 2018-511862 A | 4/2018 |
| JP | 2018-166194 A | 10/2018 |
| KR | 10-2016-0010217 A | 1/2016 |
| KR | 101842759 B1 | 3/2018 |
| KR | 10-2019-0012666 A | 2/2019 |
| WO | 2018-009931 A1 | 1/2018 |

OTHER PUBLICATIONS

Xu et al., "Vertical MoS2 Double-Layer Memristor with Electrochemical Metallization as an Atomic-Scale Synapse with Switching Thresholds Approaching 100 mV", Nano Letters, vol. 19, pp. 2411-2417, Mar. 2019.
M. Kim et al., 'Zero-static power radio-frequency switches based on $MoS_2$ atomristors' Nature Communications, vol. 9 (1), pp. 2524, (2018).
S. G. Hu et al., 'Review of Nanostructured Resistive Switching Memristor and Its Applications' Nanoscience and Nanotechnology Letters, vol. 6, No. 9, Sep. 2014, pp. 729-757.
V. K. Sangwan et al., 'Gate-tunable memristive phenomena mediated by grain boundaries in single-layer MoS2' Nature Nanotechnology, vol. 10, May 2015, pp. 403-406.
Ruijing Ge et al., 'Atomristor: Non-Volatile Resistance Switching in Atomic Sheets of Transition Metal Dichalcogenides' NANO Letters, Dec. 2017.
X. Wu et al., 'Thinnest Nonvolatile Memory Based on Monolayer h-BN' Advanced Materials, vol. 31, 1806790, 2019.
Ruijing Ge et al., 'Atomristors: Memory Effect in Atomically-thin Sheets and Record RF Switches' IEEE, 2018.
V. K. Sangwan et al., 'Multi-terminal memtransistors from polycrystalline monolayer molybdenum disulfide' Nature, vol. 554, Feb. 2018, pp. 500-517.
Z. Wang et al., 'Fully memristive neural networks for pattern classification with unsupervised learning' Nature Electronics, vol. 1, Feb. 2018, pp. 137-145.
C. Pan et al., 'Coexistence of Grain-Boundaries-Assisted Bipolar and Threshold Resistive Switching in Multilayer Hexagonal Boron Nitride' Advanced Functional Materials, vol. 27, 1604811, 2017.
H. Zhao et al., 'Atomically Thin Femtojoule Memristive Device' Advanced Materials, vol. 29, 1703232, 2017.
P. Cheng et al., 'Memristive Behavior and Ideal Memristor of 1T Phase $MoS_2$ Nanosheets' NANO Letters, vol. 16, 2016, pp. 572-576.
C. Hao et al., 'Liquid-Exfoliated Black Phosphorus Nanosheet Thin Films for Flexible Resistive Random Access Memory Applications' Advanced Functional Materials, vol. 26, 2016, pp. 2016-2024.
Da Li et al., '$MoS_2$ Memristors Exhibiting Variable Switching Characteristics towards Bio-Realistic Synaptic Emulation' ACS Nano, Sep. 2018.
C. H. Wang et al., '3D Monolithic Stacked 1T1R cells using Monolayer $MoS_2$ FET and hBN RRAM Fabricated at Low (150° C.) Temperature' IEEE, 18396930, 2018.
Fengnian Xia et al., 'Graphene Field-Effect Transistors with High On/Off Current Ratio and Large Transport Band Gap at Room Temperature' Nano Letters, 2010, vol. 10, pp. 715-718.
Gwan-Hyoung Lee et al., 'Flexible and Transparent $MoS_2$ Field-Effect Transistors on Hexagonal Boron Nitride-Graphene Heterostructures' ACS Nano, vol. 7, No. 9, 2013, pp. 7931-7936.
Yexin Deng et al., 'Black Phosphorus-Monolayer MoS2 van der Waals Heterojunction p-n Diode' ACS Nano, vol. 8, No. 8, 2014, pp. 8292-8299.
Michele Buscema et al., 'Photovoltaic effect in few-layer black phosphorus PN junctions defined by local electrostatic gating' Nature Communications, 5:4651, 2014.
Gwan-Hyoung Lee et al., 'Electron tunneling through atomically flat and ultrathin hexagonal boron nitride' Applied Physics Letters, vol. 99, 243114, 2011.
L. Britnell et al., 'Field-Effect Tunneling Transistor Based on Vertical Graphene Heterostructures' Science, vol. 335, 2012, pp. 947-950.
Miao Wang et al., 'Robust memristors based on layered two-dimensional materials' Nature Electronics, vol. 1, Feb. 2018, pp. 130-136.
Alexander A. Bessonov et al., 'Layered memristive and memcapacitive switches for printable electronics' Nature Materials, Nov. 2014.
Kai Qian et al., 'Hexagonal Boron Nitride Thin Film for Flexible Resistive Memory Applications' Advanced Functional Materials, vol. 26, 2016, pp. 2176-2184.
Gwang Hyuk Shin et al., 'Multilevel resistive switching nonvolatile memory based on $MoS_2$ nanosheet-embedded graphene oxide' 2D Materials, vol. 3, 2016, 034002.
Donghee Son et al., 'Colloidal Synthesis of Uniform-Sized Molybdenum Disulfide Nanosheets for Wafer-Scale Flexible Nonvolatile Memory' Advanced Materials, 2016.
Chaoliang Tan and Hua Zhang, 'Two-dimensional transition metal dichalcogenide nanosheet-based composites' Chem. Soc. Rev., vol. 44, 2015, pp. 2713-2731.
Juqing Liu et al., 'Preparation of $MoS_2$-Polyvinylpyrrolidone Nanocomposites for Flexible Nonvolatile Rewritable Memory Devices with Reduced Graphene Oxide Electrodes' small, 2012, 8 (22), 3517-22.
Mi Jung Lee et al., 'Synaptic devices based on two-dimensional layered single-crystal chromium thiophosphate (CrPS4)' NPG Asia Materials, vol. 10, 2018, pp. 23-30.
D. M. Guzman et al., 'First principles investigation of copper and silver intercalated molybdenum disulfide' Journal of Applied Physics, vol. 121, 2017. pp. 055703-1-055703-10.
Hannu-Pekka Komsa et al., 'From point to extended defects in two-dimensional $MoS_2$: Evolution of atomic structure under electron irradiation' Physical Review B, vol. 88, 2013, pp. 035301-1-035301-8.
Duy Le et al., 'Single-Layer $MoS_2$ with Sulfur Vacancies: Structure and Catalytic Application' The Journal of Physical Chemistry C, vol. 118, 2014, pp. 5346-5351.
Kibum Kang et al., 'Layer-by-layer assembly of two dimensional materials into wafer-scale heterostructures' Nature, 2017.
Changhong Wang et al., 'Investigation and Manipulation of Different Analog Behaviors of Memristor as Electronic Synapse for Neuromorphic Applications' Scientific Reports, vol. 6, Mar. 2016.
Fu-Chien Chiu, 'A Review on Conduction Mechanisms in Dielectric Films' Advances in Materials Science and Engineering, 2014.
Hangbing Lv et al., 'Atomic View of Filament Growth in Electrochemical Memristive Elements' Scientific Reports, vol. 5, Aug. 2015, 5, 13311.

(56) References Cited

OTHER PUBLICATIONS

Jeremy M. Beebe et al., 'Transition from Direct Tunneling to Field Emission in Metal-Molecule-Metal Junctions' *Physical Review Letters*, vol. 97, No. 2, Jul. 2006, pp. 026801-1-026801-4.
Nicolas Onofrio et al., 'Atomic origin of ultrafast resistance switching in nanoscale electrometallization cells' Nature Materials, Mar. 2015, 14(4), 440-6.
R. M. German, Chapter Seven 'Thermodynamic and Kinetic Treatments' In 'Sintering: from Empirical Observations to Scientific Principles' Butterworth-Heinemann: Boston, 2014; pp. 183-226.
Masamitsu Haemori et al., 'Impact of Cu Electrode on Switching Behavior in a Cu/HfO$_2$/Pt Structure and Resultant Cu Ion Diffusion' Applied Physics Express, vol. 2, 2009, pp. 061401-1-061401-3.
J. Park et al., 'Quantized Conductive Filament Formed by Limited Cu Source in Sub-5nm Era' International Electron Devices Meeting, Dec. 2011, pp. 3.7.1-3.7.4.
Ting Chang et al., 'Synaptic behaviors and modeling of a metal oxide memristive device' *Applied Physics A*, vol. 102, Feb. 2011, pp. 857-863.
Sung Hyun Jo et al., 'Nanoscale Memristor Device as Synapse in Neuromorphic Systems' *Nano Letters*, vol. 10, 2010, pp. 1297-1301.
Harel Z. Shouval et al. 'Spike timing dependent plasticity: a consequence of more fundamental learning rules' *Frontiers in Computational Neuroscience*, vol. 4, Article 19, Jul. 2010.
Sen Song et al., 'Competitive Hebbian learning through spike-timing-dependent synaptic plasticity' *nature neuroscience*, vol. 3, No. 9, Sep. 2000, pp. 919-926.
Wulfram Gerstner and Werner M. Kistler, 'Spiking Neuron Models: Single neurons, populations, plasticity' Cambridge University Press, 2002.
Kim et al., 'Conductive Graphitic Channel in Graphene Oxide-Based Memristive Devices' *Advanced Functional Materials*, vol. 26, 2016, pp. 7406-7414.
Rani et al., 'Non-Volatile ReRAM Devices Based on Self-Assembled Multilayers of Modified Graphene Oxide 2D Nanosheets' *small*, vol. 12, No. 44, 2016, pp. 6167-6174.
Puglisi et al., '2D h-BN based RRAM devices' *IEEE International Electron Devices Meeting (IEDM)*, 2016, pp. 34.8.1-34.8.4.
Geim et al., Van der Waals heterostructures *Nature*, vol. 499, 2013, pp. 419-425.
Duong et al., 'van der Waals Layered Materials: Opportunities and Challenges' *ACS Nano*, vol. 11, No. 12, 2017, pp. 11803-11830.
Ghorbani-Asl et al., 'Defect-induced conductivity anisotropy in MoS2 monolayers' *Physical Review B*, vol. 88, 245440 (2013).
Wu et al., 'Flexible, multilevel, and low-operating-voltage resistive memory based on MoS2-rGO hybrid' *Applied Surface Science*, vol. 463, 2019, pp. 947-952.
K. Zhu et al., 'Tristate Resistive Switching in Heterogenous Van Der Waals Dielectric Structures' *IEEE International Reliability Physics Symposium (IRPS)*, 2019, pp. 1-6.
Yuanyue Liu et al., Dislocations and Grain Boundaries in Two-Dimensional Boron Nitride, *ACS Nano*, vol. 6, No. 8, 2012, pp. 7053-7058.
Oleg v. Yazyev et al., 'MoS2 and semiconductors in the flatland' *Materials Today*, vol. 18, Issue 1, 2015.
Notice of Allowance dated Feb. 18, 2022, issued in corresponding U.S. Appl. No. 16/823,865.
Japanese Office Action dated Jan. 29, 2024 for corresponding Japanese Patent Application No. 2020-49582 and its English-language translation.
Japanese Office Action dated Mar. 18, 2024 for corresponding Japanese Patent Application No. 2020-49582 and its English-language translation.
Korean Office Action dated Mar. 19, 2024 for corresponding Korean Patent Application No. 10-2019-0112371 and its English-language translation.

\* cited by examiner

MEMRISTOR AND NEUROMORPHIC DEVICE COMPRISING THE SAME

CROSS-REFERENCE TO RELATED APPLICATIONS

This application is a continuation of U.S. application Ser. No. 16/823,865 (now U.S. Pat. No. 11,374,171), filed Mar. 19, 2020, which claims the benefits of U.S. Provisional Patent Application No. 62/862,172, filed on Jun. 17, 2019, in the U.S. Patent and Trademark Office, and Korean Patent Application No. 10-2019-0112371, filed on Sep. 10, 2019, in the Korean Intellectual Property Office, the disclosures of each of which are incorporated herein in their entirety by reference.

GOVERNMENT LICENSE RIGHTS

This invention was made with government support under 1231319 and 1541959 awarded by the National Science Foundation (NSF). The government has certain rights in the invention.

BACKGROUND

1. Field

The present disclosure relates to memristors and neuromorphic devices including the same.

2. Description of Related Art

A memristor is a non-volatile memory device that includes a plurality of memory cells. A memristor may maintain information when its power supply is cut off and thus information stored therein may be used again when power is supplied again. A memristor may be used in mobile phones, digital cameras, personal digital assistants (PDAs), mobile computer devices, stationary-type computer devices, and other devices.

Recently, research has been conducted into the use of a three-dimensional NAND in a chip that forms a next-generation neuromorphic computing platform or a neural network.

In particular, technology that allows a high integration degree and low-power characteristics and random access to memory cells is desired.

SUMMARY

Provided are vertical memristors and neuromorphic devices including the same.

Additional aspects will be set forth in part in the description which follows and, in part, will be apparent from the description, or may be learned by practice of the presented embodiments of the disclosure.

According to an aspect of an embodiment, a memristor includes: a lower electrode and an upper electrode that are spaced apart from each other; and a resistance change layer between the lower electrode and the upper electrode. The resistance change layer may include a first two-dimensional material layer and a second two-dimensional material layer that are stacked without a chemical bond between each other.

In some embodiments, the resistance change layer may include defective grain boundaries.

In some embodiments, the resistance change layer may be configured to form a conductive filament on the defective grain boundaries in response to an application of an electrical signal to the lower electrode and the upper electrode.

In some embodiments, each of the first two-dimensional material layer and the second two-dimensional material layer may include line-type defects.

In some embodiments, the resistance change layer may include dot-type defects.

In some embodiments, the memristor may be configured to operate with a set voltage in a range that is equal to or higher than about 0.1 V and equal to or lower than about 0.5 V.

In some embodiments, the memristor may be configured to perform a bipolar resistive switching operation.

In some embodiments, in the memristor after undergoing a forming operation, an ohmic conduction slope of the memristor in a high resistance state may be constant and an ohmic conduction slope of the memristor in a low resistance state may be constant.

In some embodiments, the ohmic conduction slope of the memristor in the high resistance state, the low resistance state, or both the high resistance state and the low resistance state may be in a range of about 0.8 to about 1.2.

In some embodiments, the resistance change layer may have resistance characteristics that vary in an analog manner according to a sweep of an applied electrical signal.

In some embodiments, a distance between the lower electrode and the upper electrode may be about twice to about ten times a size of atoms included in the resistance change layer.

In some embodiments, a resistance change layer may include ten or fewer two-dimensional material layers. The ten or fewer two-dimensional material layers may include the first two-dimensional material layer and the second two-dimensional material layer.

In some embodiments, the first two-dimensional material layer and the second two-dimensional material layer may include a same material.

In some embodiments, at least one of the first two-dimensional material layer and the second two-dimensional material layer may have insulating characteristics.

In some embodiments, at least one of the first two-dimensional material layer and the and the second two-dimensional material layer may include at least one of fluorographene, graphene oxide, h-BN, Mica, $MoO_3$, $WO_4$, $CuO_x$, $TiO_2$, $MnO_2$, $V_2O_5$, $TaO_4$, and $RuO_2$.

In some embodiments, at least one of the first two-dimensional material layer and the second two-dimensional material layer may have semiconductor characteristics.

In some embodiments, at least one of the first two-dimensional material layer and the second two-dimensional material layer may include at least one of $MoS_2$, $WS_2$, $MoSe_2$, $WSe_2$, $MoTe_2$, $WTe_2$, $ZrS_2$, $ZrSe_2$, $HfS_2$, $HfSe_2$, GaSe, GaTe, InSe, $In_2Se_3$, $Bi_2Se_3$, and black phosphorus.

In some embodiments, each of the first two-dimensional material layer and the second two-dimensional material layer may be a single layer.

In some embodiments, at least one of the lower electrode and the upper electrode may include a metal.

In some embodiments, lower electrode and the upper electrode may include different materials from each other.

In some embodiments, one of the lower electrode and the upper electrode may include an active electrode, and an other of the lower electrode and the upper electrode may include a non-active electrode.

In some embodiments, the resistance change layer may be arranged in the area where the lower electrode and the upper electrode overlap each other.

In some embodiments, the upper electrode, the first two-dimensional material layer, the second two-dimensional material layer, and the lower electrode may be sequentially arranged to contact each other.

In some embodiments, the upper electrode may include a plurality of first electrodes that are spaced apart from each other in a first direction that is perpendicular to a thickness direction of the resistance change layer, the lower electrode may include a plurality of second electrodes that are spaced apart from each other in a second direction that is perpendicular to the thickness direction of the resistance change layer, and the second direction may be different than the first direction.

In some embodiments, the resistance change layer may include a plurality of sub-resistance change layers that are arranged in an area where the plurality of first electrodes and the plurality of second electrodes overlap with each other, and the plurality of sub-resistance change layers may be spaced apart from each other.

According to an aspect of another embodiment, a device may include the memristor described above.

In some embodiments, the device may be configured to operate in a spike-timing dependent plasticity (STDP) manner.

According to an aspect of another embodiment, a memory device may include the memristor described above. A computing device may include the memory device.

According to an aspect of an embodiment, a memristor may include a first electrode, a second electrode, and a resistance change layer between the first electrode and the second electrode. The resistance change layer may include a plurality of two-dimensional material layers between the first electrode and the second electrode. The resistance change layer may be configured to form a conductive filament along defective grain boundaries in response to an application of a set voltage to the first electrode and the second electrode. The resistance change layer may include dot-type defects. The memristor may be configured to operate with the set voltage in a range that is equal to or higher than about 0.1 V and equal to or lower than about 0.5 V.

In some embodiments, a material of the first electrode may be different than a material of the second electrode.

In some embodiments, the resistance change layer may include a first two-dimensional material layer and a second two-dimensional material layer on the first two-dimensional material layer. The first two-dimensional material layer and the second two-dimensional material layer each may be formed of a same one of fluorographene, graphene oxide, h-BN, Mica, $MoO_3$, $WO_4$, $CuO_x$, $TiO_2$, $MnO_2$, $V_2O_5$, $TaO_4$, $RuO_2$, phosphorene, germanane, silicene, $MoS_2$, $MoSe_2$, $MoTe_2$, $WS_2$, $WSe_2$, $WTe_2$, $TaS_2$, $TaSe_2$, $TiS_2$, $TiSe_2$, $ZrS_2$, $ZrSe_2$, $HfS_2$, $HfSe_2$, $SnS_2$, $SnSe_2$, $GeS_2$, $GeSe_2$, $GaS_2$, $GaSe_2$, GaSe, GaTe, InSe, $In_2Se_3$, $Bi_2S_3$, $Bi_2Se_3$, and $Bi_2Te_3$.

In some embodiments, the resistance change layer may include a first two-dimensional material layer and a second two-dimensional material layer on the first two-dimensional material layer. The first two-dimensional material layer and the second two-dimensional material layer each may be formed of different ones of fluorographene, graphene oxide, h-BN, Mica, $MoO_3$, $WO_4$, $CuO_x$, $TiO_2$, $MnO_2$, $V_2O_5$, $TaO_4$, $RuO_2$, phosphorene, germanane, silicene, $MoS_2$, $MoSe_2$, $MoTe_2$, $WS_2$, $WSe_2$, $WTe_2$, $TaS_2$, $TaSe_2$, $TiS_2$, $TiSe_2$, $ZrS_2$, $ZrSe_2$, $HfS_2$, $HfSe_2$, $SnS_2$, $SnSe_2$, $GeS_2$, $GeSe_2$, $GaS_2$, $GaSe_2$, GaSe, GaTe, InSe, $In_2Se_3$, $Bi_2S_3$, $Bi_2Se_3$, and $Bi_2Te_3$.

According to another aspect, an electronic device such as a neuromorphic circuit may include the above-described memristor.

According to an aspect, a method of manufacturing a memristor may include forming a lower electrode on a substrate; forming a resistance change layer on the lower electrode, and forming an upper electrode on the resistance change layer. The resistance change layer may include a first two-dimensional material layer and a second two-dimensional material layer that are stacked without a chemical bond between each other.

In some embodiments, the resistance change layer may include dot-type defects. The resistance change layer may be configured to form a conductive filament on defective grain boundaries in response to an application of an electrical signal to the lower electrode and the upper electrode.

In some embodiments, the forming the resistance change layer on the lower electrode may include forming ten or fewer two-dimensional material layers on the lower electrode, and the ten or fewer two-dimensional material layers may include the first two-dimensional material layer and the second two-dimensional material layer.

In some embodiments, the first two-dimensional material layer and the second two-dimensional material layer may include a same material.

In some embodiments, the lower electrode and the upper electrode may include different materials.

In some embodiments, the upper electrode, the first two-dimensional material layer, the second two-dimensional material layer, and the lower electrode may be sequentially arranged to contact each other.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

The phrases "in some embodiments" or "in an embodiment" stated in various parts of the specification do not necessarily refer to the same embodiment.

In the present specification, the terms such as "comprise" or "include" should not be construed as necessarily including all of various elements or processes described in the specification, and it should be construed that some of the elements or the processes may not be included, or additional elements or processes may be further included.

It will also be understood that when an element is referred to as being "on" or "above" another element, the element may be in direct contact with and on/under/on the left/on the right of the other element or other intervening elements may be present.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

The terms including ordinal numbers such as ' first', ' second', etc. are used to describe various elements but the elements should not be defined by these terms. The terms are used only for distinguishing one element from another element.

Hereinafter, the present disclosure will be described in detail with reference to the accompanying drawings. The present disclosure will be described in detail below based on examples that are just for illustration, without limiting the present disclosure.

Figure 1A:
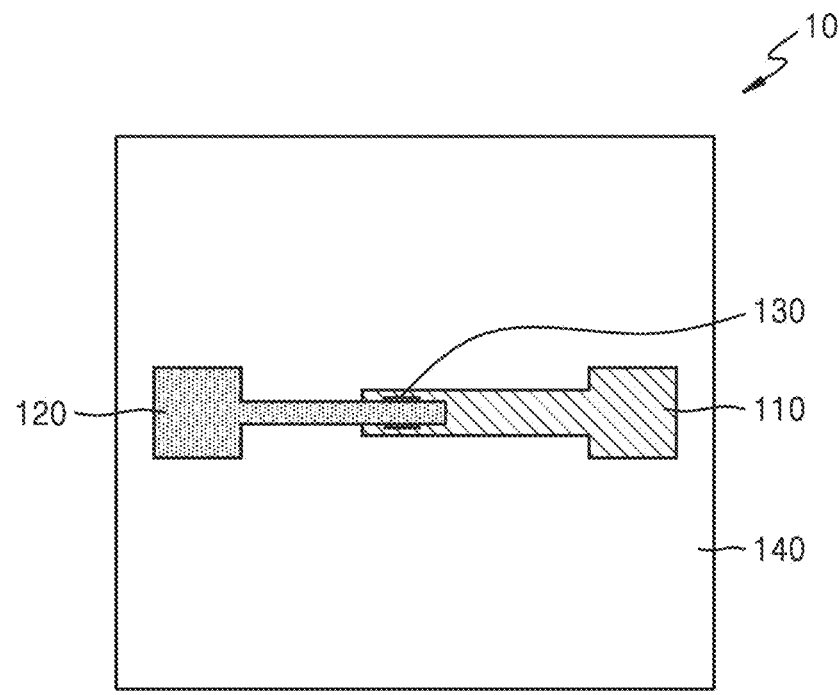
FIG. 1A is a plan view of a memristor according to an embodiment.
Figure 1B:
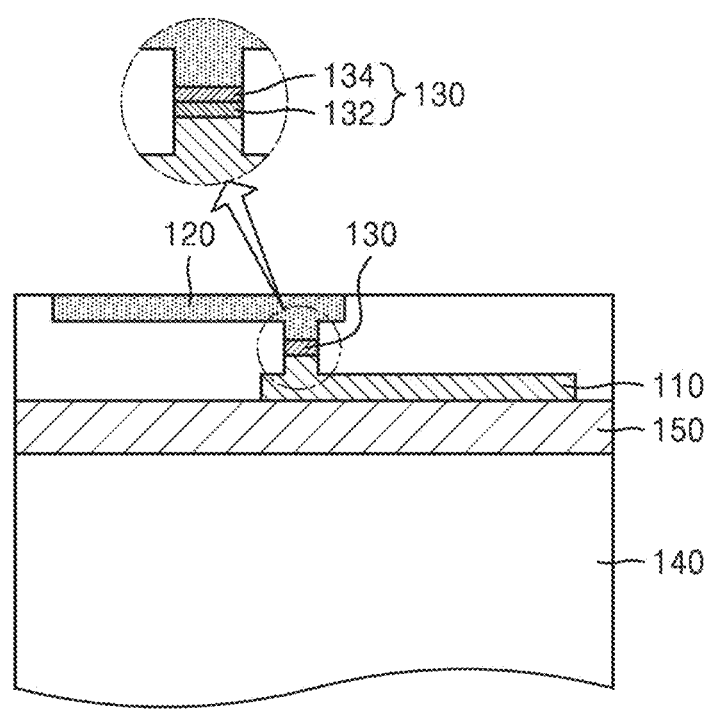
FIG. 1B is a cross-sectional view of the memristor of FIG. 1A.

FIG. 1A is a plan view of a memristor 10 according to an embodiment, and FIG. 1B is a cross-sectional view of the memristor 10 of FIG. 1A. The memristor 10 according to an embodiment may be understood as a vertical memristor. As illustrated in FIGS. 1A and 1B, the memristor 10 may include first and second electrodes 110 and 120 that are apart from each other and a resistance change layer 130 between the first and second electrodes 110 and 120. A thickness direction of the resistance change layer 130 may be parallel to a direction from the first electrode 110 to the second electrode 120. Also, the resistance change layer 130 may be arranged in an area in which the first and second electrodes 110 and 120 overlap with each other in the thickness direction of the resistance change layer 130.

The memristor 10 may further include a substrate 140 supporting the first electrode 110. For example, a semiconductor (e.g., silicon substrate) may be used as the substrate 140. However, the substrate 140 is not limited thereto, and a substrate of various materials may be used. Also, a substrate of a flexible material such as a plastic substrate may be used as the substrate 140. An insulating layer 150 to insulate the substrate 140 and the first electrode 110 from each other may be further provided on an upper surface of the substrate 140. The insulating layer 150 may include, for example, a silicon oxide, a silicon nitride, or the like, but is not limited thereto. When the substrate 140 includes an insulating material, the insulating layer 150 may not be provided on the upper surface of the substrate 140.

The first electrode 110 may be formed on the substrate 140 and may be referred to as a lower electrode, and the second electrode 120 may be formed on the resistance change layer 130 and referred to as an upper electrode. The first and second electrodes 110 and 120 may include a conductive material. For example, the first and second electrodes 110 and 120 may include at least one of various conductive materials such as graphene, carbon nanotubes (CNTs), and metals such as Al, Au, Cu, Ir, Ru, Pt, Ti, TiN, Ta, TaN, Cr, or the like, and/or combinations thereof.

The first and second electrodes 110 and 120 may be formed of a same material or different materials. For example, one of the first and second electrodes 110 and 120 may be an active electrode having a high degree of ionization, and the other may be a non-active electrode having a low degree of ionization. Whether an electrode is an active electrode or a non-active electrode may be determined by a voltage applied thereto.

The resistance change layer 130 may be configured to store information as a resistance of the resistance change layer 130 is changed by an electrical signal applied to the first and second electrodes 110 and 120. A thickness of the resistance change layer 130 may be in atomic scale. For example, the resistance change layer 130 may have a thickness of several tens of nanometers or less (e.g., 20 nm to 100 nm and/or 30 nm to 70 nm). An operating voltage of the memristor 10 is determined by the thickness of the resistance change layer 130, and thus, the smaller the thickness of the resistance change layer 130, the lower the operating voltage of the memristor 10. For example, when the resistance change layer 130 has a thickness of several tens of nanometers, an operating voltage of the memristor 10 may be 10 V or lower, and when the resistance change layer 130 has a thickness of several nanometers, an operating voltage of the memristor 10 may be 1 V or lower. However, when the thickness of the resistance change layer 130 is too small, the memristor 10 may react even to a very small voltage and thus may be unstable. The resistance change layer 130 according to the embodiment may have a thickness that is about twice to about ten times or less a size of atoms in the resistance change layer 130.

The resistance change layer 130 may include a two-dimensional material (2D material) layer having a layered structure. A two-dimensional material layer includes a single-layer or half-layer solid in which atoms are in a certain crystalline structure. The resistance change layer 130 may include two to ten or fewer layers of two-dimensional layers. For example, the resistance change layer 130 may include first and second two-dimensional material layers 132 and 134 sequentially arranged from the first electrode 110 to the second electrode 120. A plurality of two-dimensional material layers may be stacked in a thickness direction, without a chemical bond therebetween. Thus, ionic migration between the two-dimensional material layers is easy.

When forming the resistance change layer 130 by using a single-layer two-dimensional material layer, the memristor 10 may react even to a very small voltage, for example, a set voltage of 0.1 V or lower. This may undermine the stability of the memristor 10. According to the memristor 10 according to the embodiment, the resistance change layer 130 may include a plurality of two-dimensional material layers, and the plurality of two-dimensional material layers may be stacked in a thickness direction without a chemical bond therebetween. Because the memristor 10 includes a plurality of two-dimensional material layers stacked without a chemical bond therebetween, the memristor 10 requires and/or uses a higher operating voltage than a memristor having a resistance change layer with only a single-layer two-dimensional material layer. However, the memristor 10 according to the embodiment requires and/or uses a lower operating voltage than a memristor where the resistance change layer includes two-dimensional material layers that are chemically bonded in a thickness direction or a horizontal memristor. Thus, the memristor 10 according to the embodiment may operate at a set voltage equal to or higher than 0.1 V and equal to or lower than 0.5 V (and/or equal to or lower than 0.3 V).

The two-dimensional material layer of the resistance change layer 130 may be formed of a material having insulating characteristics. For example, the two-dimensional material layer may include at least one of fluorographene, graphene oxide, h-BN, Mica, $MoO_3$, $WO_4$, $CuO_x$, $TiO_2$, $MnO_2$, $V_2O_5$, $TaO_4$, and $RuO_2$.

The two-dimensional material layer may include a material having semiconductor characteristics. For example, the two-dimensional material layer may include at least one selected from the group consisting of a transition metal dichalcogenide (TMD), phosphorene (black phosphorus), germanane, and silicene. The TMD may include, for example, at least one selected from the group consisting of $MoS_2$, $MoSe_2$, $MoTe_2$, $WS_2$, $WSe_2$, $WTe_2$, $TaS_2$, $TaSe_2$, $TiS_2$, $TiSe_2$, $ZrS_2$, $ZrSe_2$, $HfS_2$, $HfSe_2$, $SnS_2$, $SnSe_2$, $GeS_2$, $GeSe_2$, $GaS_2$, $GaSe_2$, GaSe, GaTe, InSe, $In_2Se_3$, $Bi_2S_3$, $Bi_2Se_3$, and $Bi_2Te_3$.

In the memristor 10 having a vertical structure, as illustrated in FIGS. 1A and 1B, a distance between the first and second electrodes 110 and 120 is in an atomic-scale range, and thus, when a voltage is applied to the first and second electrodes 110 and 120, ions emitted from one of the first and second electrodes 110 and 120 may form an atomic-scale conductive filament. For example, the memristor 10 may form an atomic-scale filament at a voltage of 0.5 V or lower. The memristor 10 forming an atomic-scale filament as described above may be referred to as an electrochemical metallization memory (ECM). The ECM operation of the memristor 10 is different from the operating principle of a valence change memory (VCM), whereby vacancies, for example, sulfur vacancies, move to form a conductive channel. The ECM operation of the memristor 10 may improve the stability and set/reset voltage characteristics compared to a VCM device.

In detail, a voltage may be applied between the first and second electrodes 110 and 120. As an amplitude of the applied voltage is increased, an active electrode is oxidized and ions are emitted from the active electrode. The ions move to another electrode, for example, to a non-active electrode, via the resistance change layer 130 to form a conductive filament in the resistance change layer 130. Also, ions that have passed through the resistance change layer 130 are reduced in the non-active electrode to be deposited in the active electrode. A current flowing in the resistance change layer 130 may correspond to a size of the conductive filament.

The conductive filament may be formed along defective grain boundaries having defects in the resistance change layer 130. According to the first-principle density functional theory, a voltage for diffusing a conductive filament through the defective grain boundaries may be significantly lower than a voltage for diffusing a conductive filament through a crystalline part of a two-dimensional material layer. For example, a voltage for diffusing a conductive filament through grain boundaries of a $MoS_2$ layer is about 0.3 eV, whereas a voltage for diffusing a conductive filament through crystalline boundaries of a $MoS_2$ layer is about 3.9 eV. Accordingly, the memristor 10 according to the embodiment may operate at a lower voltage by forming the conductive filament through the defective grain boundaries of the resistive change layer 130 instead of through the crystalline part of the two-dimensional material layer(s) in the resistive change layer 130.

Meanwhile, each two-dimensional material layer of the resistance change layer 130 has line-type defects on the grain boundaries. As two-dimensional material layers are stacked a plurality of times, some portions of the line-type defects may overlap each other and some other portions thereof may not overlap each other. As line-type defects overlap each other, the resistance change layer 130 may have overall dot-type defects. In the memristor 10 according to the embodiment, the resistance change layer 130 having a dot-type defect may operate more stably than a resistance change layer having a line-type defect. That is, the resistance change layer 130 including only a single-layer two-dimensional material layer may operate even at a small voltage and thus may be unstable.

In addition, the memristor 10 according to the embodiment performs a bipolar resistive switching operation and may be constant even when a set voltage and a reset voltage are repeatedly applied thereto. Here, a high resistance state (HRS) refers to a state in which a resistance of the resistance change layer 130 is high and thus a current hardly flows, and a low resistance state (LRS) refers to a state in which a resistance of the resistance change layer 130 is low and thus a current flows easily. A set voltage refers to an amplitude of a voltage that generates a resistance change in the resistance change layer 130 from a high resistance state to a low resistance state, and a reset voltage refers to an amplitude of a voltage that generates a resistance change in the resistance change layer 130 from a low resistance state to a high resistance state.

Moreover, in the memristor 10, after forming, an ohmic conduction slope of the high resistance state thereof may be nearly equal to an ohmic conduction slope of the low resistance state thereof. For example, the ohmic conduction slope in the high resistance state and the ohmic conduction slope in the low resistance state may be both included in a range of about 0.8 to about 1.2. As the ohmic conduction slope in the high resistance state is nearly equal to the ohmic conduction slope in the low resistance state, the memristor 10 according to the embodiment may operate stably.

The resistance change layer 130 may include a plurality of two-dimensional material layers (e.g., 2 to 10 two-dimensional material layers) that are the same material or different materials. For example, the first and second two-dimensional material layers 132 and 134 may be same type of material (e.g., both materials with semiconductor characteristics or both materials with insulating characteristics) or different types of materials (e.g., one the first and second two-dimensional materials has insulating characteristics and the other of the first and second two-dimensional materials has semiconductor characteristics).

In embodiments where the first and second-two dimensional material layers 132 and 134 may be the same type of material, the first and second-two dimensional material layers 132 and 134 may be the same material or different materials. For example, the first and second-two dimensional material layers 132 and 134 may be formed of a same one or a different one of fluorographene, graphene oxide, h-BN, Mica, $MoO_3$, $WO_4$, $CuO_x$, $TiO_2$, $MnO_2$, $V_2O_5$, $TaO_4$, and $RuO_2$. For example, the first and second-two dimensional material layers 132 and 134 may be formed of a same one or a different one of a transition metal dichalcogenide (TMD), phosphorene (black phosphorus), germanane, and silicene. The TMD may include, for example, at least one selected from the group consisting of $MoS_2$, $MoSe_2$, $MoTe_2$, $WS_2$, $WSe_2$, $WTe_2$, $TaS_2$, $TaSe_2$, $TiS_2$, $TiSe_2$, $ZrS_2$, $ZrSe_2$, $HfS_2$, $HfSe_2$, $SnS_2$, $SnSe_2$, $GeS_2$, $GeSe_2$, $GaS_2$, $GaSe_2$, GaSe, GaTe, InSe, $In_2Se_3$, $Bi_2S_3$, $Bi_2Se_3$, and $Bi_2Te_3$.

Alternatively, when the resistance change layer 130 includes more than two 2D material layers (e.g., 3 to 10 2D material layers), some of the 2D material layers may be the same material or same type of material and others of the 2D materials may be different materials.

Figure 2:
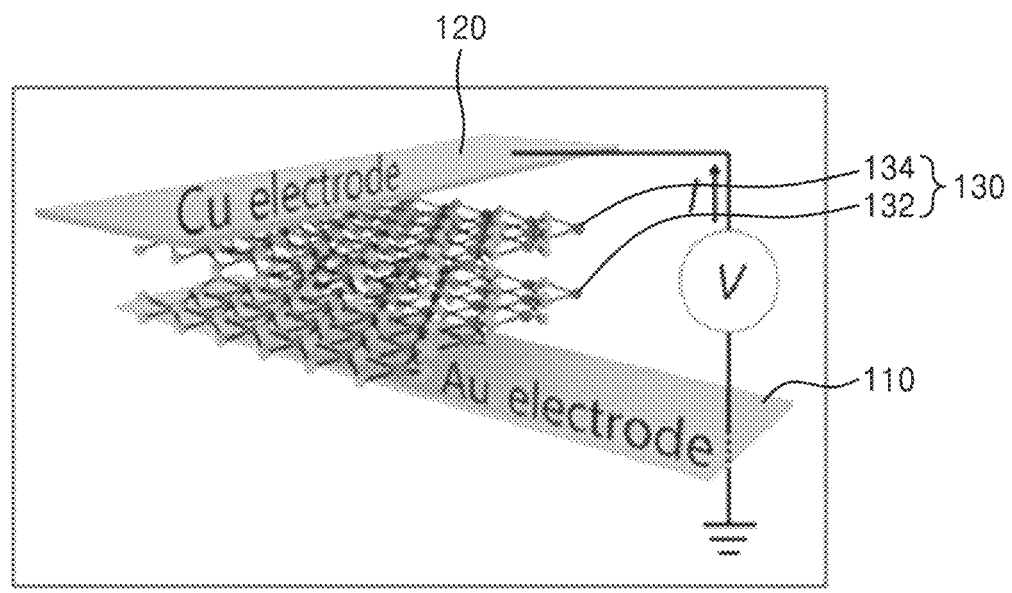
FIG. 2 is a detailed view of a memristor including two two-dimensional material layers, according to an embodiment.

FIG. 2 is a detailed view of a memristor 10 including two two-dimensional material layers, according to an embodiment. As illustrated in FIG. 2, the memristor 10 may include first and second electrodes 110 and 120 that are apart from each other and first and second two-dimensional material layers 132 and 134 each having a single-layer structure, between the first and second electrodes 110 and 120. The first electrode 110, the first two-dimensional material layer 132, the second two-dimensional material layer 134, and the second electrode 120 may be sequentially arranged to contact each other.

The first electrode 110 may be a lower electrode and may be patterned on a substrate 140 by standard photolithography. Two-dimensional material layers may be synthesized into a single layer by metal-organic chemical vapor deposition (MOCVD). Also, the two-dimensional material layers may be transferred onto the first electrode 110 by using a vacuum stacking process. As a single layer of a two-dimensional material is transferred onto the first electrode 110 layer by layer, the resistance change layer 130 may be formed. A plurality of two-dimensional material layers are transferred in units of layers by using a vacuum stacking process, and thus, no chemical bond between the two-dimensional material layers occurs. Each of the two-dimensional material layers includes defective grain boundaries having line-type defects, whereas a multi-layered two-dimensional material layer may include grain boundaries having dot-type defects. While only two layers, that is, the first and second two-dimensional material layers 132 and 134, are illustrated in the drawing, the present disclosure is not limited thereto. Also, the second electrode 120 may be deposited on the resistance change layer 130 as an upper electrode.

To check the characteristics of the memristor 10, the first electrode 110 including Au of about 35 nm and Cr of about 5 nm was patterned on the substrate 140. Also, the two layers of the two-dimensional material layer 130 of $MoS_2$ were transferred onto the first electrode 110 by using a vacuum stacking process, and the second electrode 120 including Cu of about 35 nm was formed on the two-dimensional material layer. A cross-section of the memristor 10 was set to about $2\times2$ $\mu m^2$.

Figure 3A:
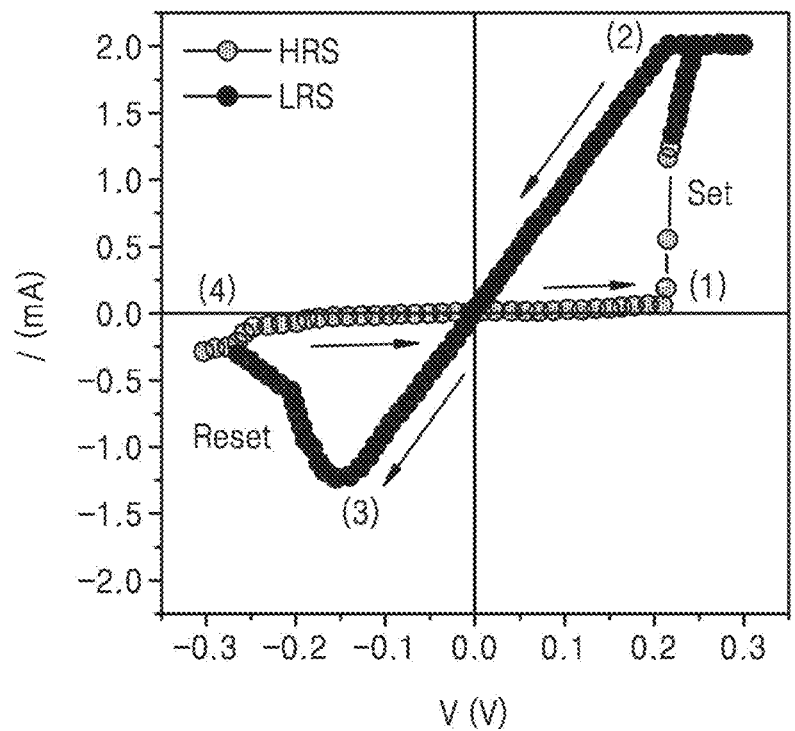
FIG. 3A shows I-V characteristics of a memristor according to an embodiment.

FIG. 3A shows I-V characteristics of a memristor according to an embodiment. A voltage sweep rate was set to 0.15 V/s, and in detail, a sweep stage of a voltage was set to 3 mV, and a period of each sweep stage was set to 20 nm. As a result, as illustrated in FIG. 3A, it is determined that the memristor performs a bipolar resistive switching operation in a voltage sweep range between about −0.3 V and about 0.3 V. In FIG. 3A, it is determined that a set voltage was about 0.25 V, and a reset voltage was about −0.15 V. It is determined that the memristor operates at a set voltage and a reset voltage that have an absolute value equal to or higher than 0.1 V and equal to or lower than 0.5 V as above.

Referring to FIGS. 1A, 1B, and 3A, as shown in (1)→(2) in FIG. 3A, the memristor 10 may be changed from the high resistance state (HRS) to the low-resistance state (LRS) by applying a set voltage SET to the memristor 10 through the first and second electrodes 110 and 120 to form conductive filaments by the movement of metal ions through the resistance change layer 130. As shown in (3)→(4) of FIG. 3A, the memristor 10 may be changed from the low resistance state (LRS) to the high resistance state (HRS) applying a Reset voltage to the memristor 10 through the first and second electrodes 110 and 120, which disconnects the conductive filament in the resistance change layer 130 by limiting and/or stopping the movement of metal ions through the resistance change layer 130.

Figure 3B:
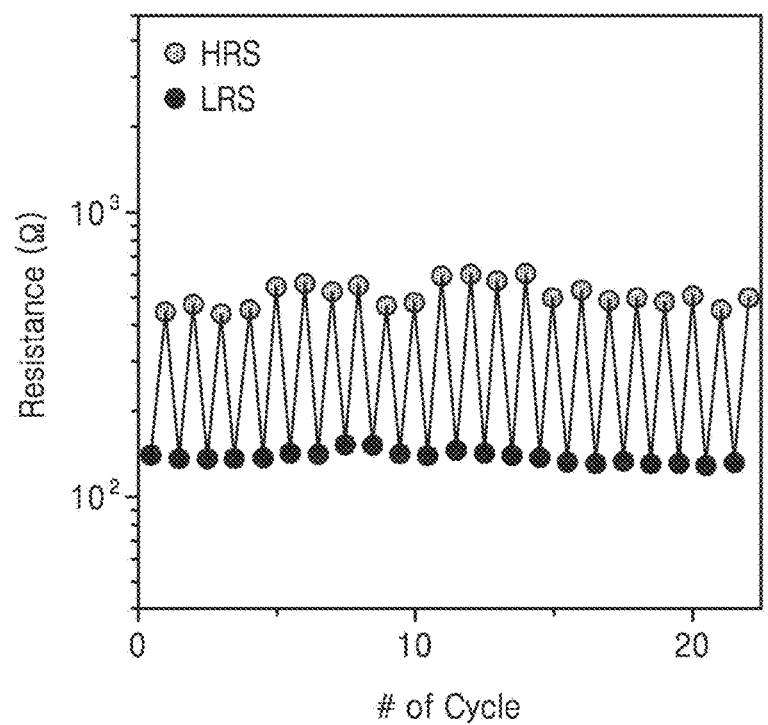
FIG. 3B is a graph showing resistance values between a high resistance state and a low resistance state of a memristor according to an embodiment.

FIG. 3B is a graph showing resistance values between a high resistance state and a low resistance state of a memristor according to an embodiment. As illustrated in FIG. 3B, even when a voltage sweep is repeatedly performed, the memristor according to the embodiment has a constant resistance value in the high resistance state and a constant resistance value in the low resistance state. This indicates that the memristor according to the embodiment is non-volatile.

Figure 3C:
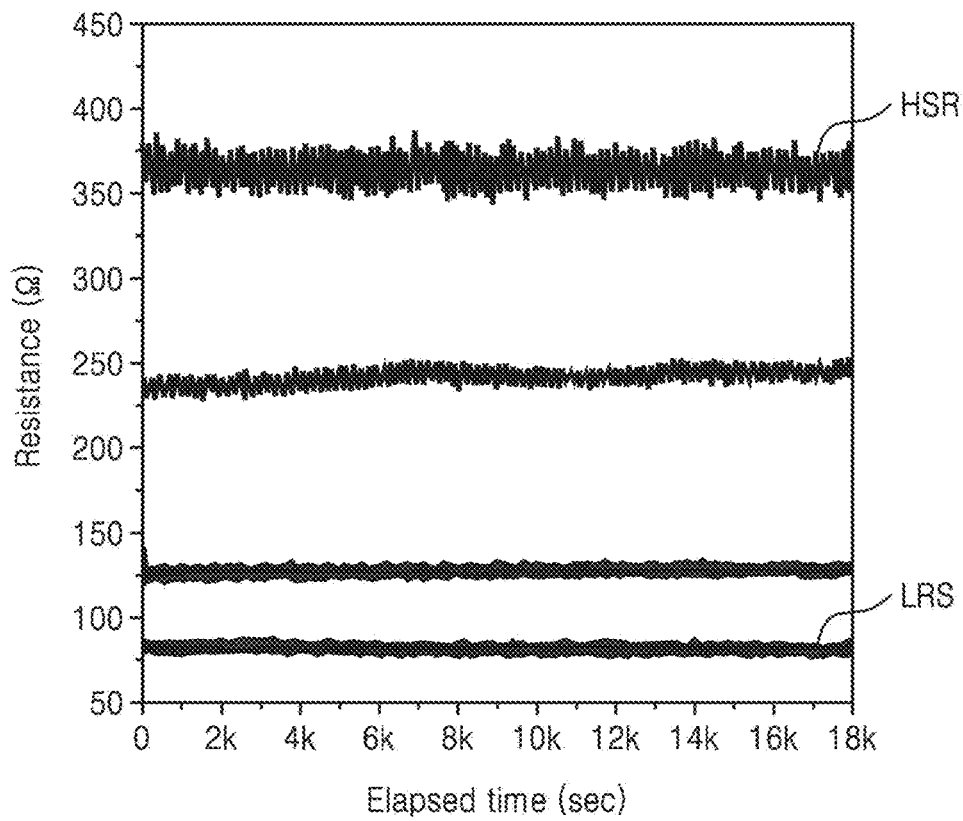
FIG. 3C is a reference diagram showing a memristor according to an embodiment has various resistance states.

FIG. 3C is a reference diagram showing that the memristor according to the embodiment has various resistance states. Referring to FIG. 3C, the memristor may have not only a resistance value in the high resistance state and a resistance value in the low resistance state, but also may have a resistance value between the high resistance state and the low resistance state. This means that the memristor 10 may perform a bipolar resistive switching operation. Also, as illustrated in FIG. 3C, even as time passes, a resistance of a constant size may be maintained.

Figure 3D:
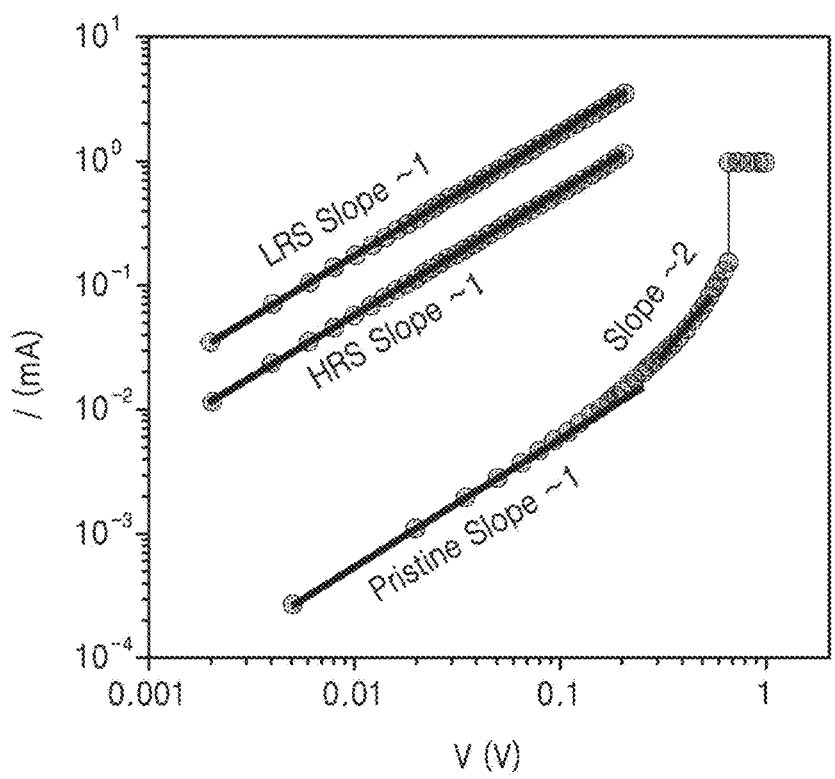
FIG. 3D shows I-V characteristics of a memristor according to an embodiment, before and after forming.

FIG. 3D shows I-V characteristics of a memristor according to an embodiment, before and after forming. A resistance in a pristine state before forming is greater than a resistance after a forming operation (e.g., applying a voltage of 1 V or greater to the memristor). In a pristine state, the memristor according to the embodiment had an ohmic conduction slope of about 1 until a voltage of 0.3 V. Also, in a pristine state, a slope of the memristor with respect to a voltage from 0.3 V to 0.6 V varied.

On the other hand, the memristor 10 has a lower resistance after the forming than the memristor 10 before forming. In detail, a resistance of the memristor 10 after forming, with respect to a high resistance state, was about 180Ω, and a resistance thereof with respect to a low resistance state was about 50Ω.

In addition, the ohmic conduction slope of the memristor 10 in the high resistance state after forming and an ohmic conduction slope of the memristor 10 in the low resistance state after forming were constant. Also, although resistances of the memristor 10 in the high resistance state may be different from the low resistance state after forming, the ohmic conduction slope of the memristor 10 in the high resistance state and the ohmic conduction slope of the memristor 10 in the low resistance state were both about 1.

In some embodiments, such as when the resistance change layer 130 is just two 2D material layers, the forming operation may be omitted.

Figure 4:
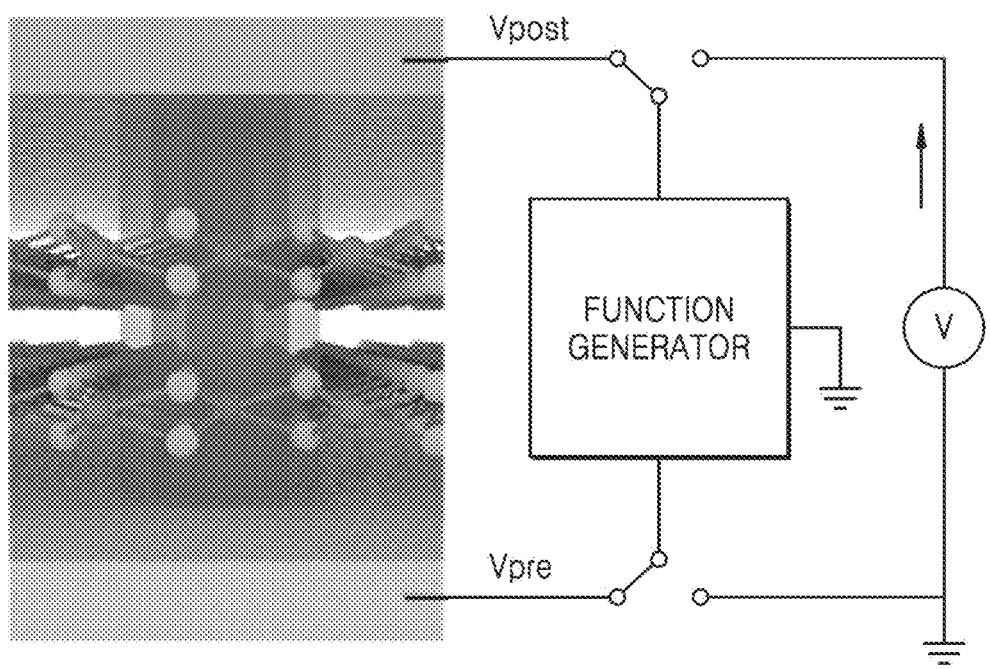
FIG. 4 shows a result of photographing the memristor of FIG. 2 by using a scanning transmission electron microscope having high-angle annular dark-field imaging (HAADF) function.

FIG. 4 shows a result of photographing the memristor of FIG. 2 by using a scanning transmission electron microscope having high-angle annular dark-field imaging (HAADF) function. As illustrated in FIG. 4, a conductive filament formed between the first and second electrodes 110 and 120 was formed not on the crystalline boundaries of the two-dimensional material layer but on the grain boundaries thereof.

To check whether bipolar resistance switching characteristics of the memristor 10 according to the embodiment result from the resistance change layer 130, a voltage was applied to the first and second electrodes 110 and 120 and a current was measured to calculate a total resistance $R_T$ of the memristor 10. Voltages respectively measured from the first and second electrodes 110 and 120 and a current flowing through the memristor 10 was measured to calculate a resistance $R_{2D}$ of the resistance change layer 130.

For example, as shown in FIG. 4 and referring to FIG. 2, the measurement setup included a voltage generator V and a function generator (e.g., application circuit) connected in parallel to the second electrode 120 and first electrode 110 of the memristor 10 through respective probes. The function generator applied a STDP (spike timing dependent plasticity) algorithm to the memristor 10, based on turning the switches connected Vpost probe and the Vpre probe on and off to adjust the bias applied to the memristor. The STDP algorithm made a different bias at the memristor when a certain pulse was applied to the memristor 10 with a time difference. For example, postsynaptic and presynaptic voltage pulses, Vpost and Vpre, were applied at the top and bottom electrodes (see second electrode 120 and first electrode 110 of memristor in FIG. 2) to provide a voltage (V=Vpost−Vpre) across the memristor 10. While the function generator of FIG. 4 was used to apply a STDP algorithm to the memristor 10, inventive concepts are not limited thereto, and the function generator in other embodiments could employ different algorithms for regulating the voltage pulses, Vpost and Vpre, applied to the memristor 10.

Figure 5A:
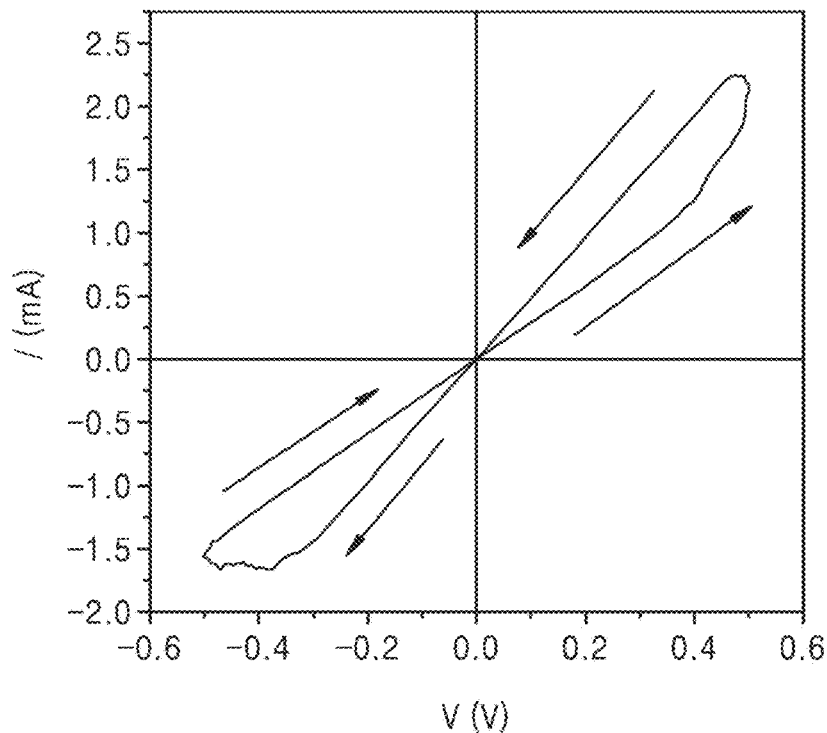
FIG. 5A is a graph showing I-V characteristics of a memristor including two two-dimensional layers according to an embodiment.
Figure 5B:
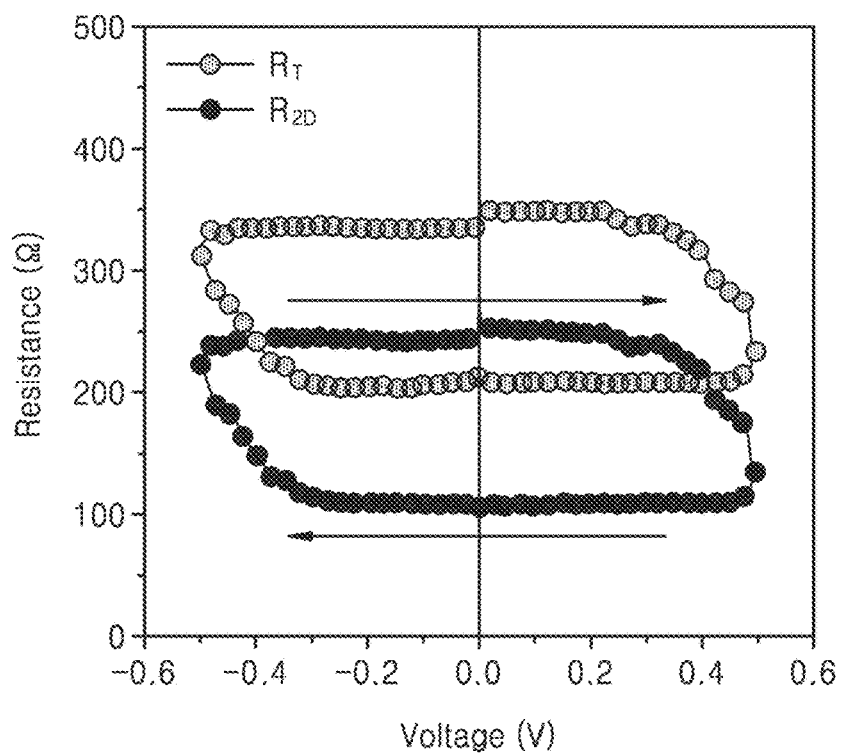
FIG. 5B is a graph showing resistance characteristics of a memristor.

FIG. 5A is a graph showing I-V characteristics of the memristor 10 including two two-dimensional material layers, according to the embodiment. FIG. 5B is a graph showing resistance characteristics of the memristor 10. As shown in FIG. 5A, it is shown that the memristor 10 including two two-dimensional material layers has bipolar characteristics. Also, as illustrated in FIG. 5B, as the total resistance change $R_T$ of the memristor 10 and the resistance change $R_{2D}$ of the resistance change layer 130 are similar to each other, it is determined that resistance characteristics of the memristor 10 result from the resistance characteristics of the resistance change layer 130.

Figure 6A:
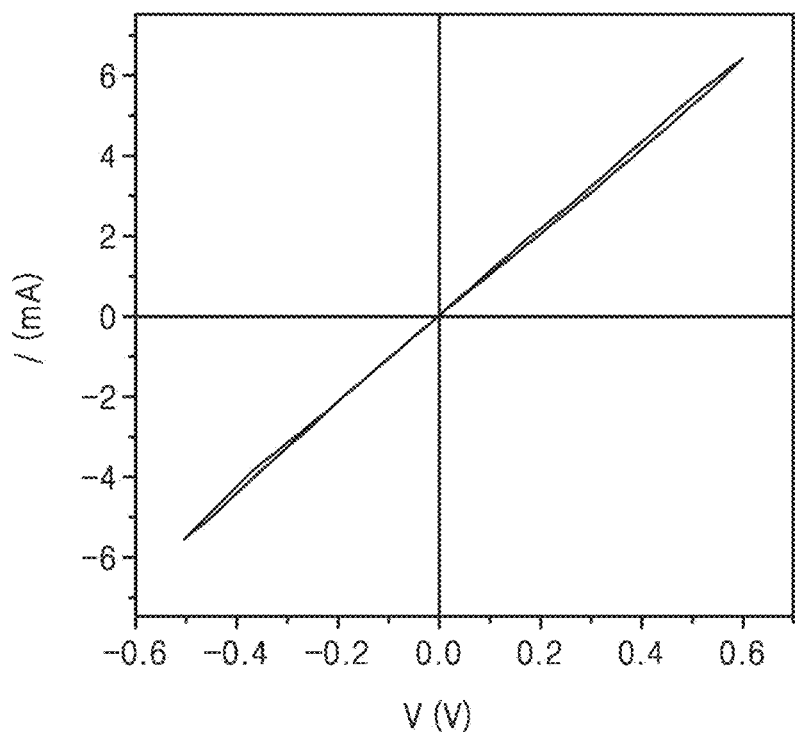
FIG. 6A shows I-V characteristics of a memristor including a single-layer two-dimensional material layer, as a comparative example.
Figure 6B:
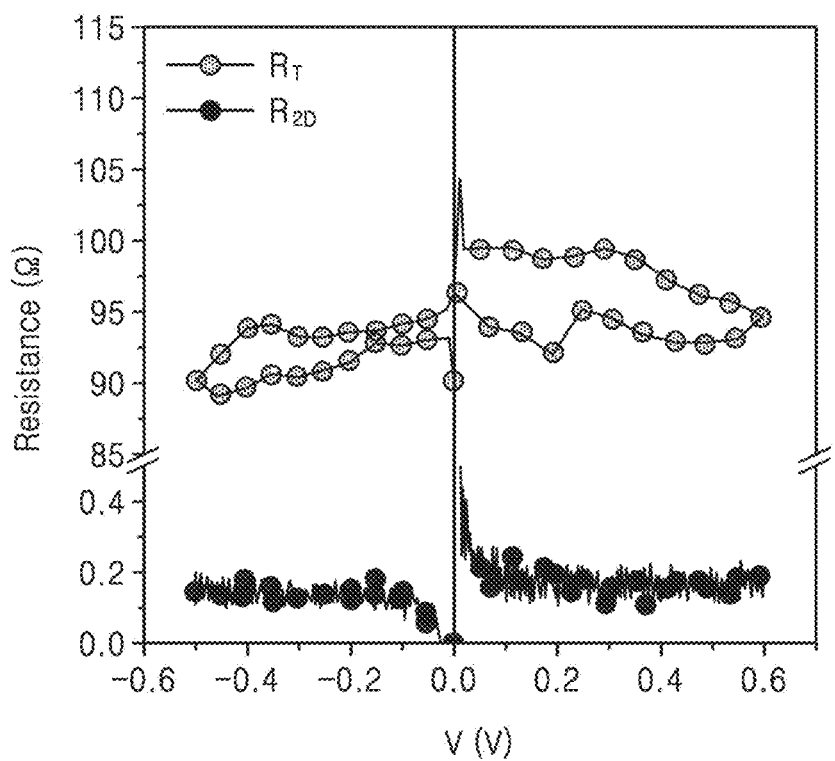
FIG. 6B is a graph showing resistance characteristics of a memristor including a single-layer two-dimensional material layer.

FIG. 6A shows I-V characteristics of a memristor including a single-layer two-dimensional material layer, as a comparative example. FIG. 6B is a graph showing resistance characteristics of the memristor including a single-layer two-dimensional material layer. As illustrated in FIG. 6A, hysteresis characteristics of the memristor including a single-layer two-dimensional material layer are not clear. That is, it is determined that the memristor including a single-layer two-dimensional material layer does not have bipolar characteristics. Also, as illustrated in FIG. 6B, total resistance characteristics of the memristor including a single-layer two-dimensional material layer and resistance characteristics of a resistance change layer are not similar to each other. Accordingly, it is determined that the resistance characteristics of the memristor are affected not only by the resistance characteristics of the resistance change layer but also other factors. It is determined here that, in order for a memristor to have bipolar characteristics, a two-dimensional material layer needs to include a plurality of layers.

Figure 7A:
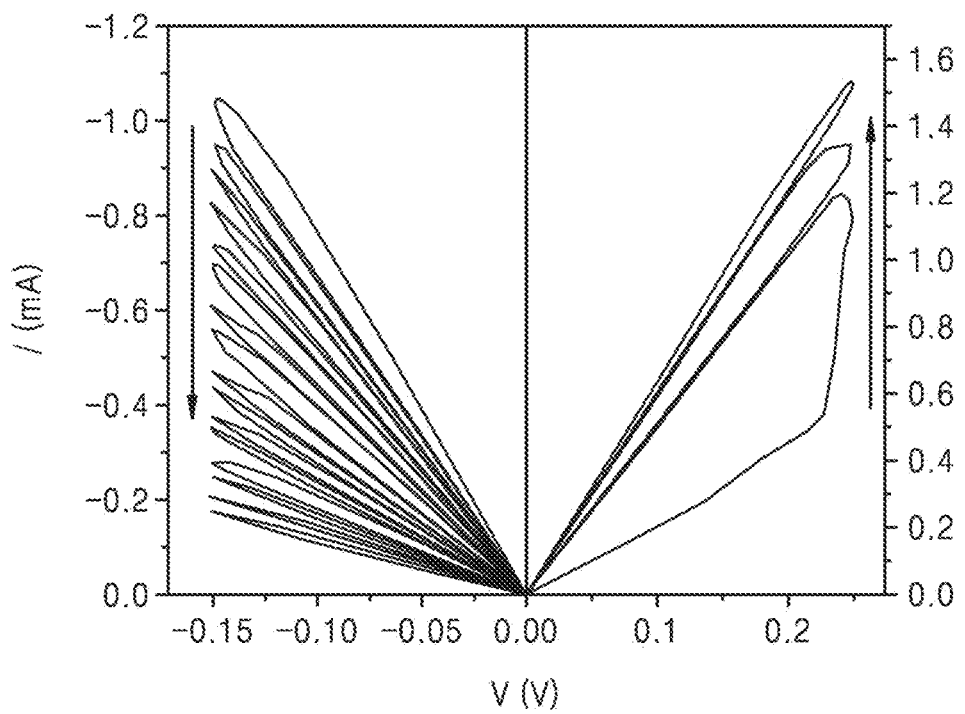
FIG. 7A is a graph showing a voltage sweep applied to a memristor according to an embodiment.
Figure 7B:
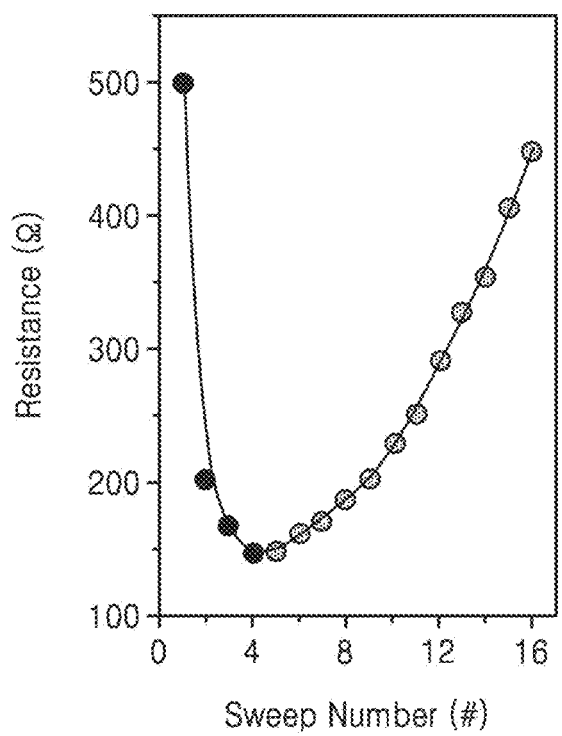
FIG. 7B is a graph showing a resistance of a memristor according to the voltage sweep of FIG. 7A.

The memristor 10 according to the embodiment may have analog-type resistance switching characteristics. By sweeping a direct current (DC) voltage, depression and potentiation of the memristor 10 were measured. FIG. 7A is a graph showing a voltage sweep applied to a memristor 10 according to an embodiment. FIG. 7B is a graph showing a resistance of the memristor 10 according to the voltage sweep of FIG. 7A. As shown in FIG. 7A, in a range of about 0 V to about 0.25 V, when a voltage sweep of a positive polarity is performed, as shown in FIG. 7B, the higher the number of voltage sweeps, a resistance of the memristor 10 gradually decreased from about 450Ω to about 150Ω.

As shown in FIG. 7A, in a range of about 0 V to about −0.15 V, when a voltage sweep of a negative polarity is performed, as shown in FIG. 7B, the higher the number of voltage sweeps, a resistance of the memristor 10 gradually increased from about 150Ω to about 500Ω. The memristor 10 according to the embodiment has analog-type resistance switching characteristics.

The memristor 10 according to the embodiment may also have depression and potentiation characteristics at other types of voltages than a DC voltage. For example, the memristor 10 may have depression and potentiation characteristics at a pulse voltage.

Figure 8:
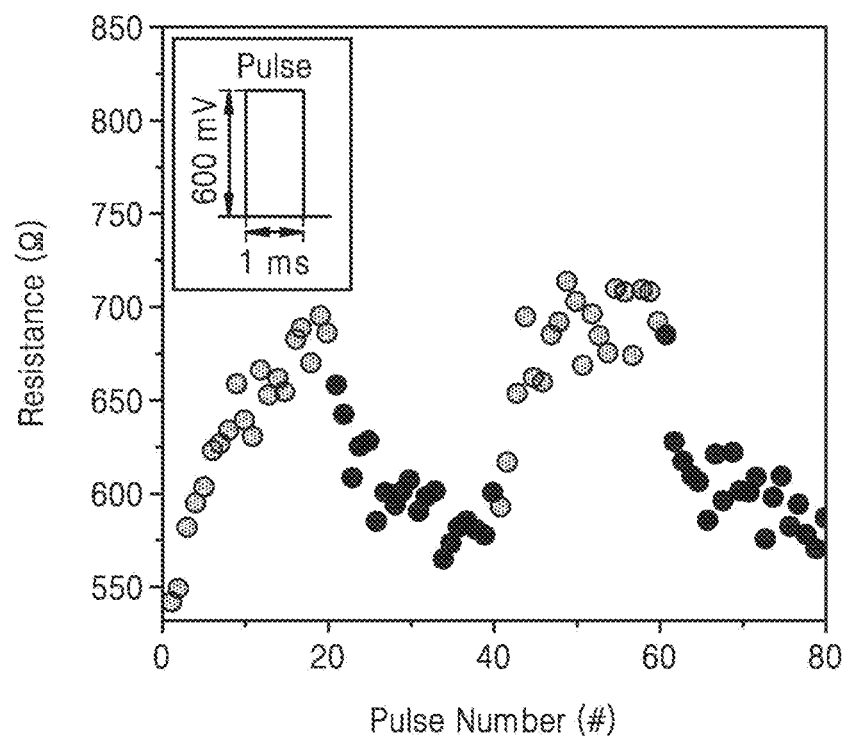
FIG. 8 shows resistance characteristics of a memristor at a pulse-type voltage, according to an embodiment.

FIG. 8 shows resistance characteristics of the memristor 10 at a pulse-type voltage, according to an embodiment. A sequence of negative and positive pulses was applied to the memristor 10 by setting a pulse amplitude to 0.6 V, a pulse period to 1 ms, and a pulse interval to 5 seconds. As a result, resistance characteristics as shown in FIG. 8 were obtained. It is determined that resistance of the memristor 10 decreases as the number of times a positive pulse is applied increases, and the resistance of the memristor 10 increases as the number of times a negative pulse is applied increases.

As the memristor 10 according to the embodiment has bipolar resistive switching characteristics and analog-type resistance switching characteristics, the memristor 10 according to the embodiment may act as an artificial synapse. The memristor 10 according to the embodiment may perform a synapse-like learning operation such as spike-timing-dependent plasticity (STDP). STDP at a low switching voltage allows low-power neuromorphic computing. Moreover, a low switching voltage is also close to a biological electric potential, and thus, a direct interface with a neural network of mammals may also be possible. Accordingly, the memristor 10 according to the embodiment may be used as a component of a neuromorphic device.

To check whether the memristor 10 according to the embodiment operates in an STDP manner, a post voltage Vpost may be applied to the first electrode 110 and a pre voltage Vpre may be applied to the second electrode 120 to thereby apply a synapse pulse to the resistance change layer 130.

Figure 9A:
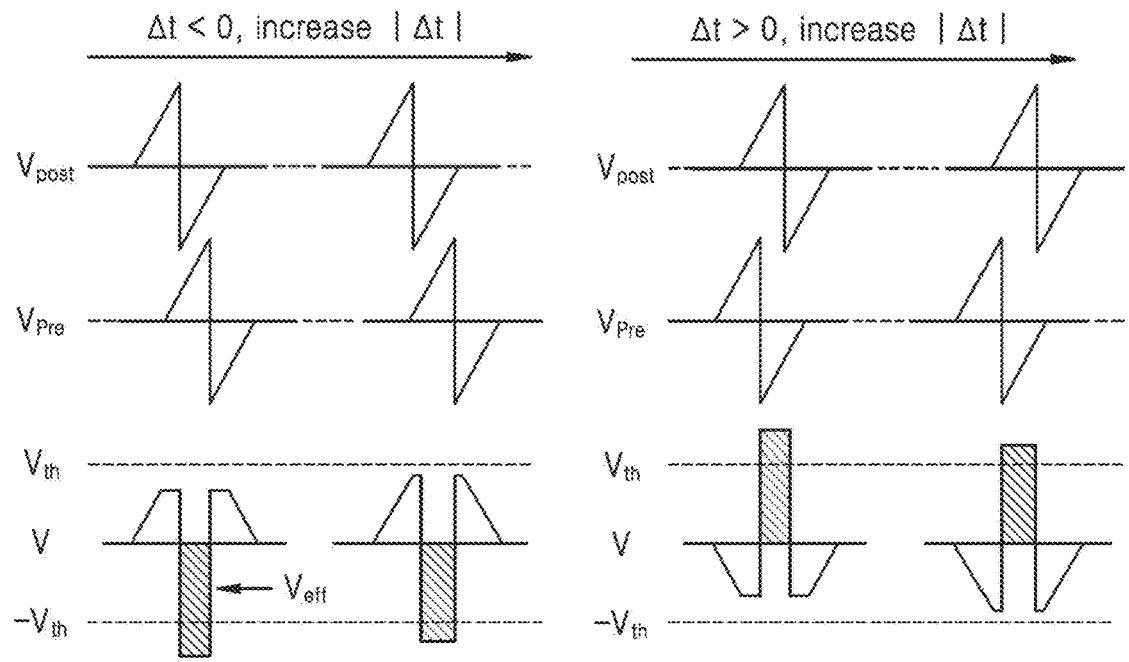
FIG. 9A is a reference diagram illustrating a voltage applied to a memristor according to an embodiment.

FIG. 9A is a reference diagram illustrating a voltage applied to the memristor 10 according to the embodiment. A post voltage Vpost and a pre voltage Vpre have an identical shape, linearly increase from 0 V to 0.175 V during a period of 1 ms, and linearly increase from −0.175 V to 0 V during another period of 1 ms. The above two voltages may be respectively applied to the first and second electrodes 110 and 120 at different times.

As shown in FIG. 9A, when the post voltage Vpost is applied before the pre voltage Vpre (Δt<0), an absolute value of a negative voltage applied to the resistance change layer 130 is greater than an absolute value of an effective voltage Veff. The negative voltage is in a pulse form, and thus, may be referred to as a presynaptic pulse. Also, when the post voltage Vpost is applied after the pre voltage Vpre (Δt>0), an absolute value of a positive voltage applied to the resistance change layer 130 is greater than an absolute value of the effective voltage Veff. The positive voltage is in a pulse form, and thus, may be referred to as a postsynaptic pulse.

Figure 9B:
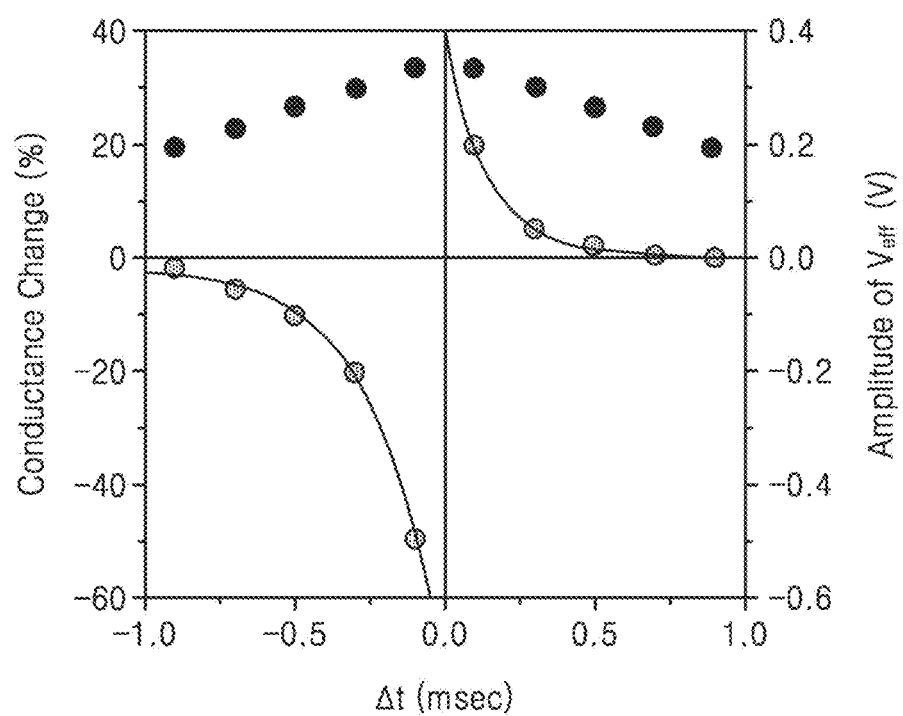
FIG. 9B is a result showing changes in conductance and an effective voltage of a memristor according to signals of FIG. 9A.

FIG. 9B is a result showing changes in conductance and an effective voltage of the memristor 10 according to signals of FIG. 9A. As shown in FIG. 9B, when Δt<0, the less Δt, the higher the amplitude of the effective voltage, and thus, it is shown here that negative voltage polarity is reinforced. Accordingly, this indicates that the degree of depression is further reinforced. Also, change in conductance regarding Δt is attenuated exponentially whether the effective voltage is positive or negative. This indicates that the memristor 10 according to the embodiment may be used as a component of a neuromorphic device operating in an STDP manner.

Figure 10:
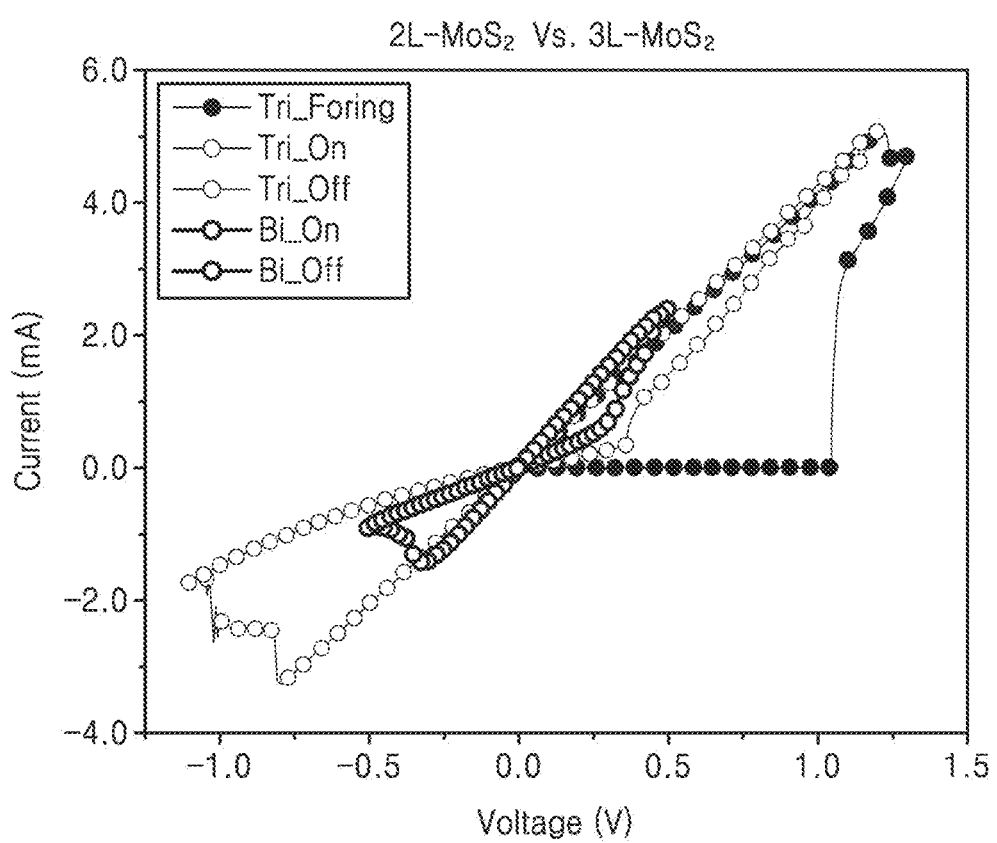
FIG. 10 is a graph showing I-V characteristics of a memristor including three resistance change layers, according to an embodiment.

FIG. 10 is a graph showing I-V characteristics of a memristor including a three-layered resistance change layer, according to an embodiment. As shown in FIG. 10, when a forming operation in which a voltage of about 1 V or higher is applied to the memristor including a three-layered resistance change layer, after the forming operation, the memristor has bipolar resistance switching characteristics.

Figure 11A:
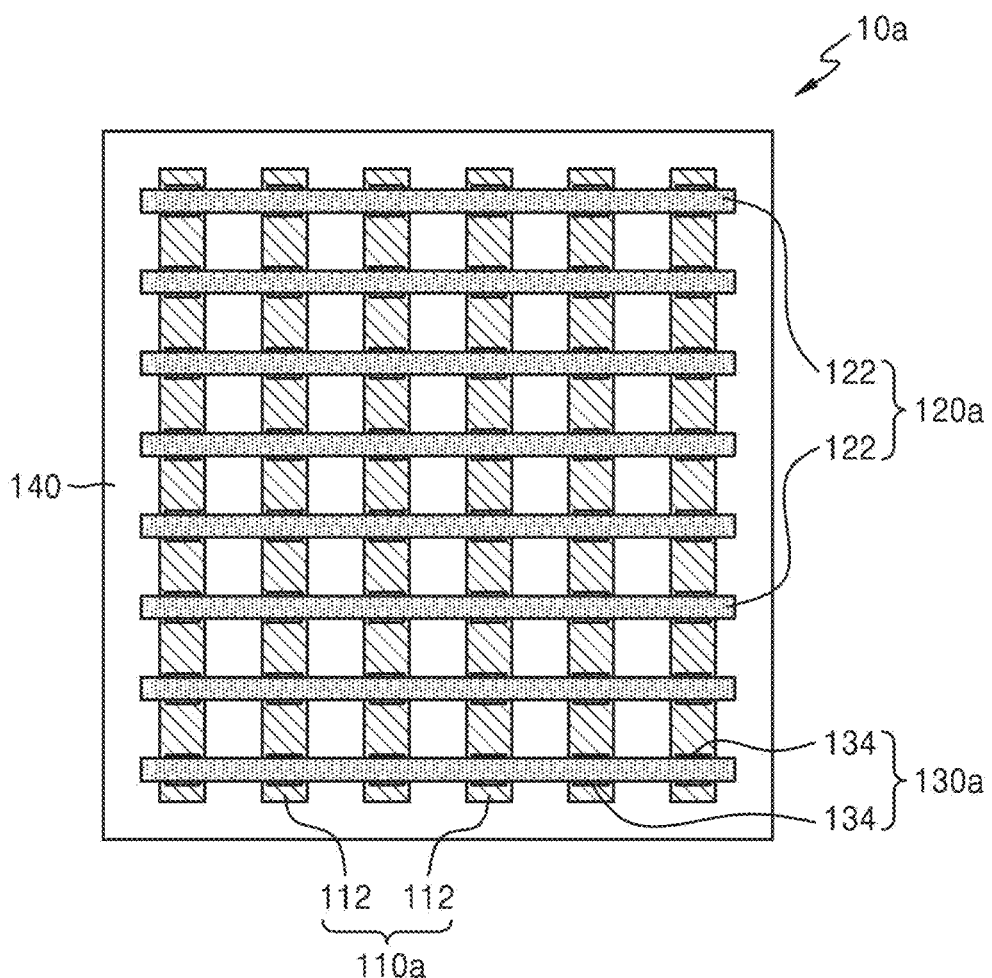
FIGS. 11A and 11B illustrate a memristor according to another embodiment.
Figure 11B:
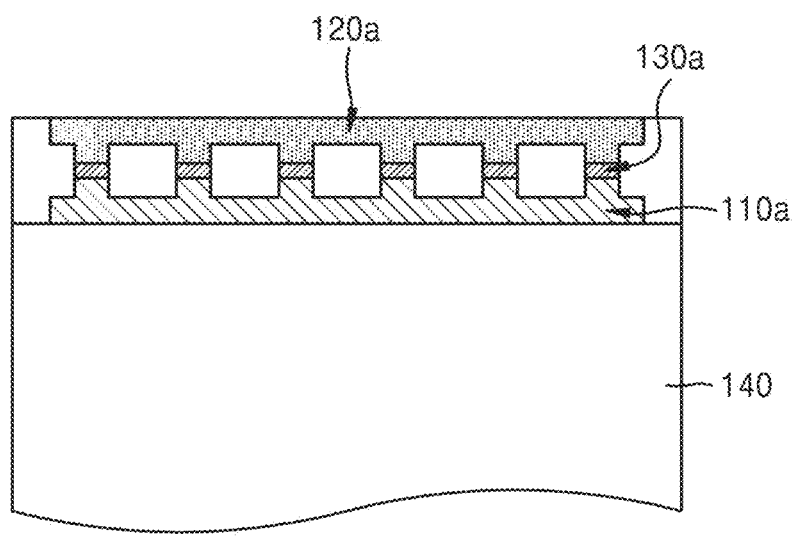

FIGS. 11A and 11B illustrate a memristor 10a according to another embodiment. As illustrated in FIGS. 11A and 11B, the memristor 10a may include first and second electrodes 110a and 120a that are apart from each other and a resistance change layer 130a between the first and second electrodes 110a and 120a. The first electrode 110a may include a plurality of first sub-electrodes 112 that are apart from each other in a first direction perpendicular to a thickness direction of the resistance change layer 130a, and the second electrode 120a may include a plurality of second sub-electrodes 122 that are apart from each other in a second direction that is perpendicular to the thickness direction of the resistance change layer 130a and different from the first direction. Also, the resistance change layer 130a may include a plurality of sub-resistance change layers 134 that are arranged in an area where the plurality of first sub-electrodes 112 and the plurality of second sub-electrodes 122 overlap each other and that are apart from each other. That is, the memristor 10a may include a plurality of cells that may operate independently of each other.

Figure 12:
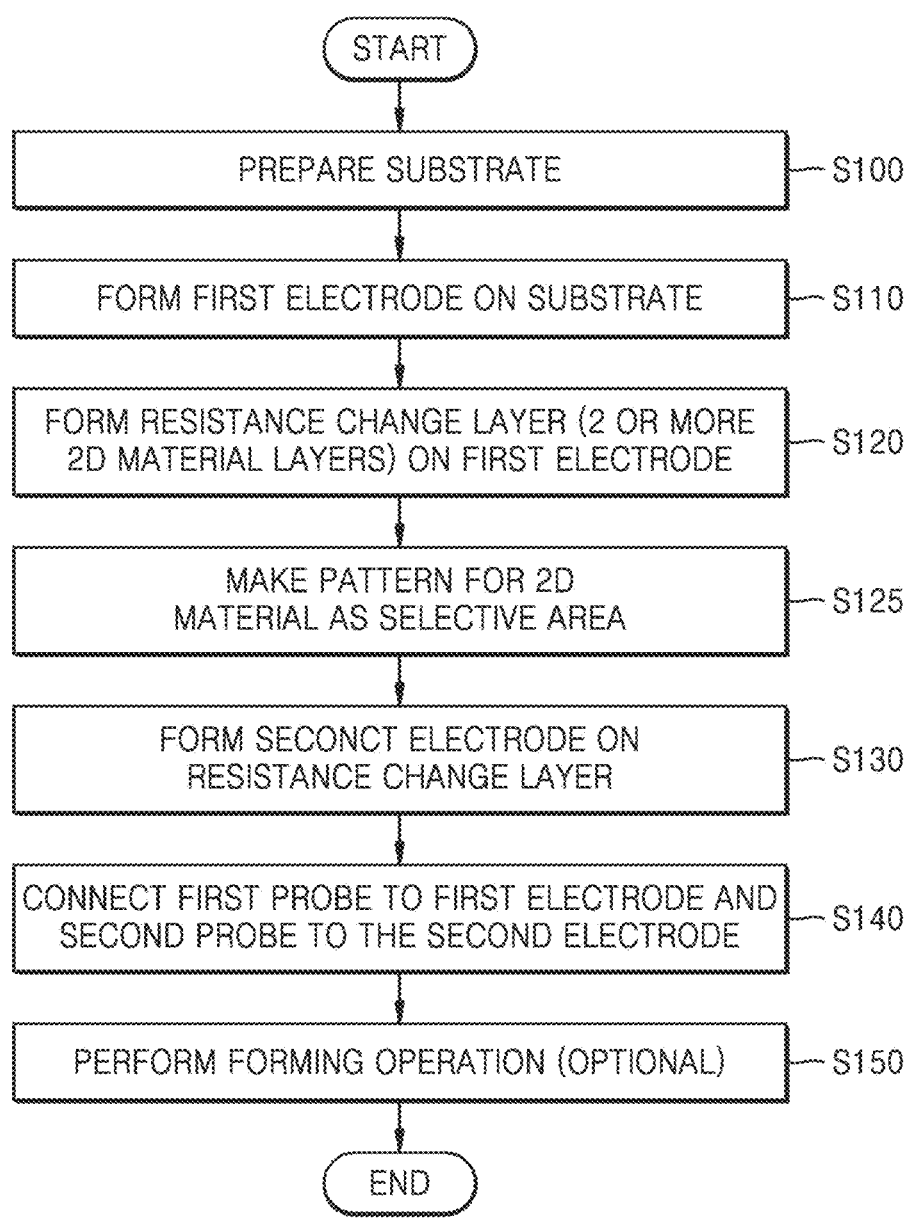
FIG. 12 is a flow chart illustrating operations for a method of manufacturing a memristor according to an embodiment.

FIG. 12 is a flow chart illustrating operations for a method of manufacturing a memristor according to an embodiment.

Referring to FIGS. 1A, 1B, and 12, a method of manufacturing a memristor 10 may include preparing a substrate 140 (S100), forming a first electrode 110 on the substrate 140 (S110), forming a resistance change layer 130 including 2D material layers on the first electrode 110 (S120), patterning a selected area of the resistance change layer 130 (S125), and forming a second electrode 120 on the patterned resistance change layer 130 (S130). Thereafter, as shown in FIGS. 4 and 12 (S140), a first probe for applying a pre voltage Vpre may be connected to the first electrode 110 and a second probe for applying a post voltage Vpost may be connected to the second electrode 120 and the first and second probes may be connected to function generator (e.g., application circuit) and voltage generator (e.g., power circuit). Additionally, a forming operation optionally may be performed on the memristor 10 (S150). The forming operation may involve applying a voltage with a magnitude that is greater than or equal to 1 V (e.g., 1 V to 2 V) to the memristor 10 using the first electrode 110 and second electrode 120. For example, the forming operation may be performed on the memristor 10 when the resistance change layer 130 includes 3 or more (e.g., 3 to 10 2D material layers for a total thickness of greater than 1 nm) 2D material layers, but inventive concepts are not limited thereto.

In operation S100, the substrate 140 may be prepared as a semiconductor substrate (e.g., silicon substrate), an insulating material (e.g., silicon oxide) or another material such as a plastic substrate. As shown in FIG. 1B, an insulating layer 150 (e.g., silicon oxide, silicon nitride, or the like) may be deposited on an upper surface of the substrate 140 before forming the first electrode 110 on the substrate 140. A CVD process may be used for depositing the insulating layer 150, but inventive concepts are not limited thereto. Also, the formation the insulating layer 150 may be omitted in some embodiments, such as embodiments where the substrate 140 is an insulating material.

In operation S110, first electrode 110 may be patterned on the substrate 140 (or stacked structure including the substrate 140 and insulating layer 150) by standard photolithography and etching. Two-dimensional material layers may be synthesized into a single layer by metal-organic chemical vapor deposition (MOCVD). Also, in operation S120, the two-dimensional material layers of the resistance change layer 130 may be transferred onto the first electrode 110 using a vacuum stacking process. As a single layer of a two-dimensional material is transferred onto the first electrode 110 layer by layer, the resistance change layer 130 may be formed. A plurality of two-dimensional material layers may be transferred in units of layers by using a vacuum stacking process, and thus, no chemical bond between the two-dimensional material layers occurs. While FIG. 1B illustrates a non-limited example where the resistance change layer 130 only has two layers, that is, the first and second two-dimensional material layers 132 and 134, the present disclosure is not limited thereto.

After transferring the resistance change layer 130 onto the first electrode 110, the resistance change layer 130 may be patterned to provide the resistance change layer 130 on a selected area over the first electrode 110 (S125). Next, in operation S130, the second electrode 120 may be deposited on the resistance change layer 130 as an upper electrode. Like the first electrode 110, the second electrode 120 may be patterned on the resistance change layer 130 using standard photolithography and etching. The first and second electrodes 110 and 120 may be formed of a same material, same type of metal (e.g., both 2D material layers with semiconductor characteristics or both 2D material layers with insulating characteristics) or different materials.

In some embodiments, the memristors 10 and 10a described above may be applied to various electronic devices such as a memory device including the memristor, a computing device including the memory device, a synapse device, a neuromorphic circuit, a neuromorphic apparatus, and the like.

Figure 13:
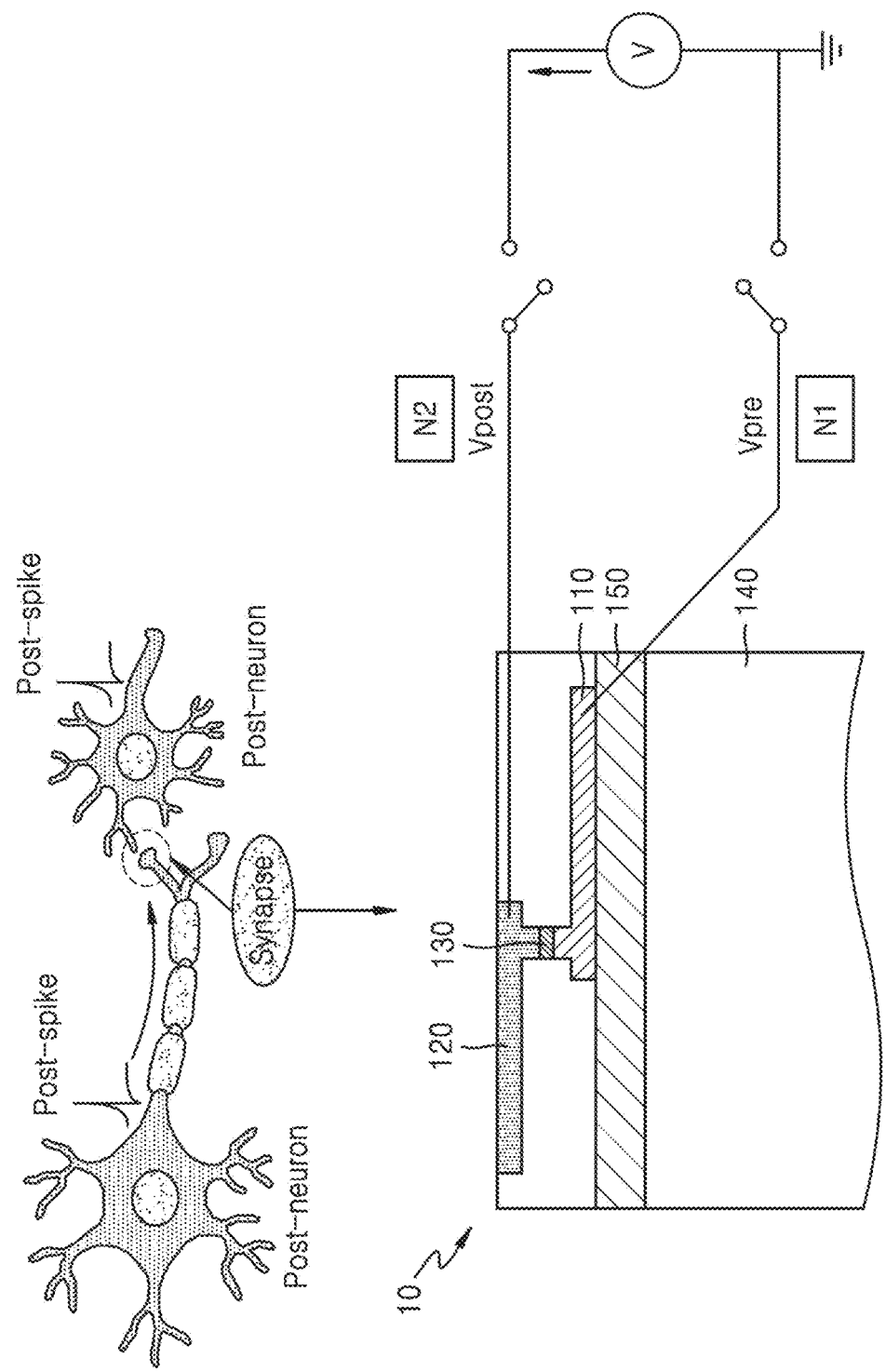
FIG. 13 is a diagram of a synapse device according to an embodiment.

FIG. 13 is a diagram of a synapse device according to an embodiment.

Regarding FIG. 13, the memristor 10 in FIGS. 1A and 1B and/or memristor 10 in FIGS. 11A and 11B may be applied to an electronic device, such as the synapse device in FIG. 13. In FIG. 13, the synapse device may include a first node N1 corresponding to a pre-neuron and a second node N2 corresponding to a post-neuron. The first node N1 and second node N2 may be connected to a voltage generator through respective switches. The first electrode 110 of the memristor may be connected to the first node N1 through a first probe. The second electrode 120 may be connected to the second node N2 through a second probe. The memristor 10 may correspond to a synapse between the first node N1 and second node N2. The voltage generator (e.g., power circuit) may be configured to apply a voltage to the memristor through the first probe and second probe connected to the first electrode 110 and second electrode 120, respectively.

Figure 14:
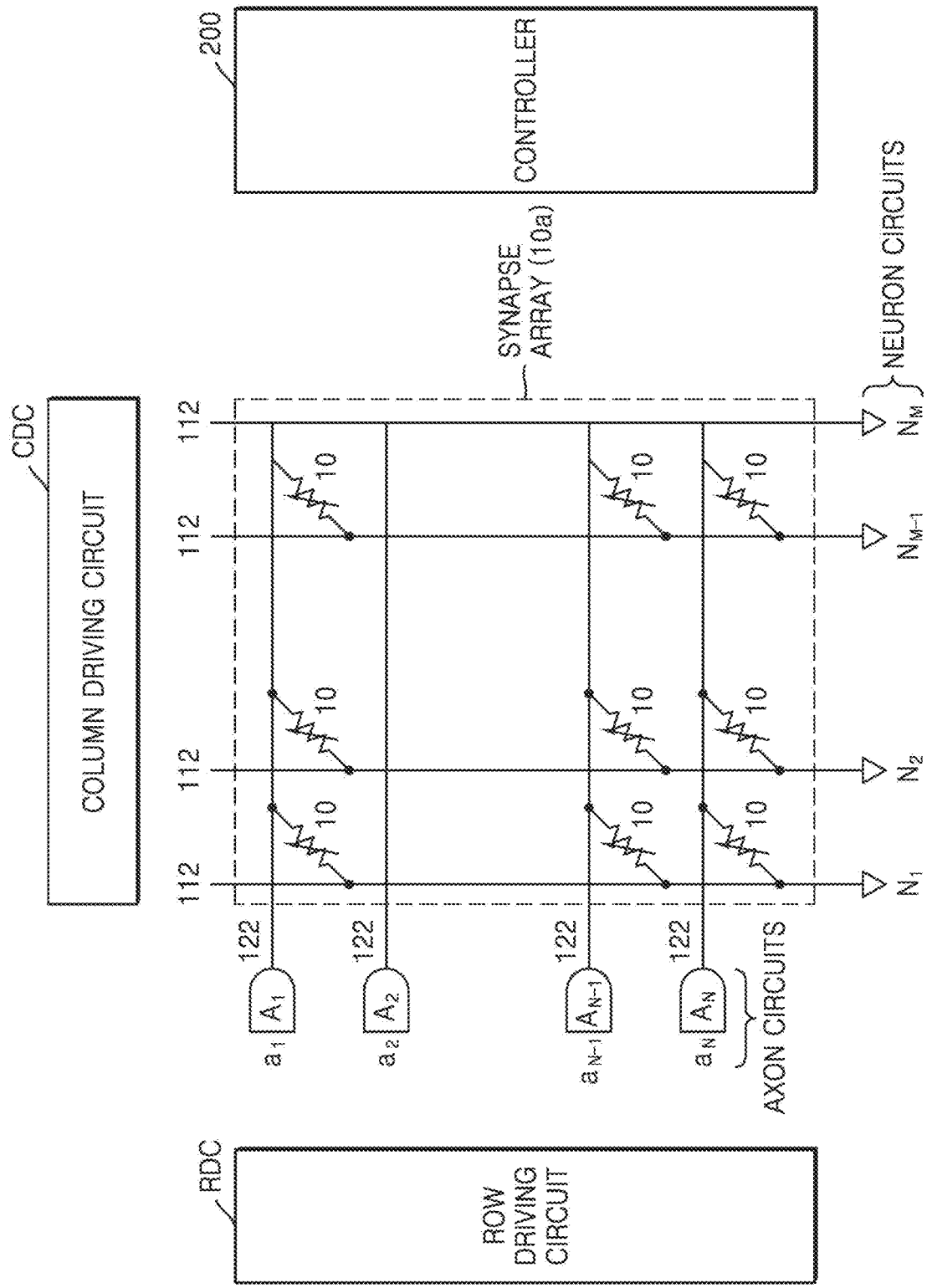
FIG. 14 is a diagram of a neuromorphic circuit according to an embodiment.

FIG. 14 is a diagram of a neuromorphic circuit according to an embodiment.

Referring to FIGS. 1A, 1B, and 14, the neuromorphic circuit may include a synapse array 10a having a plurality of memristors 10 in FIGS. 1A and 1B arranged in a plurality of rows and a plurality of columns. A column driving circuit CDC may be connected to columns of the memristors 10 through first sub-electrodes 112. A row driving circuit RDC may be connected to rows of the memristors 10 through second sub-electrodes 122. A controller 200 (e.g., processor) may control the voltages applies to the memristors 10 through the row driving circuit RDC and column driving CDC. The pre-synaptic signal Vpre may be applied to the first electrodes 110 of the memristors 10 through the first sub-electrodes 112. A post-synaptic signal Vpost may be applied to the second sub-electrodes 120 of the memristors through the second sub-electrodes 122.

The controller 200 may include processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The memory controller 200 may operate in response to requests from a host (not shown) or instructions stored in a memory (not shown) and may be configured to access the synapse array 10a and control operations of the neuromorphic circuit, thereby transforming the controller 200 into a special purpose controller.

For example, in response to instructions stored in a memory (not shown) or instructions from a host (not shown), the controller may perform a synapse-like learning operation such as spike-timing-dependent plasticity (STDP) on the synapse array 10a.

Figure 15:
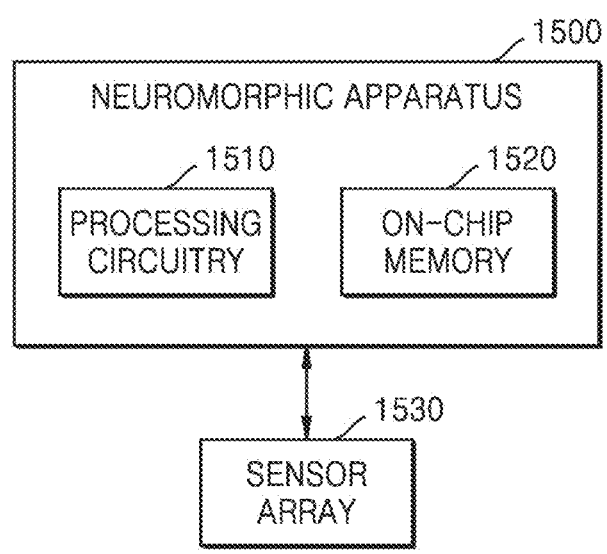
FIG. 15 is a diagram illustrating a neuromorphic apparatus and an external device connected thereto according to an embodiment.

FIG. 15 is a diagram illustrating a neuromorphic apparatus and an external device connected thereto according to an embodiment.

Referring to FIG. 15, a neuromorphic apparatus 1500 may include processing circuitry 1510 and/or memory 1520. The neuromorphic apparatus 1500 may include a memory based on the neuromorphic circuit of FIG. 15.

In some example embodiments, processing circuitry 1510 may be configured to control functions for driving the neuromorphic apparatus 1500. For example, the processing circuitry 1510 may be configured to control the neuromorphic apparatus 1500 by executing programs stored in the memory 1520 of the neuromorphic apparatus 1500. In some example embodiments, the processing circuitry may include hardware such as logic circuits; a hardware/software combination, such as a processor executing software; or a combination thereof. For example, a processor may include, but is not limited to, a central processing unit (CPU), a graphics processing unit (GPU), an application processor (AP) included in the neuromorphic apparatus 1500, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), or the like. In some example embodiments, the processing circuitry 1510 may be configured to read/write various data from/in the external device 1530 and/or execute the neuromorphic apparatus 1500 by using the read/written data. In some embodiments, the external device 1530 may include a sensor array with an image sensor (e.g., CMOS image sensor circuit).

In some embodiments, the neuromorphic circuit and/or neuromorphic apparatus in FIGS. 14 and 15 may be applied in a machine learning system. The machine learning system may utilize a variety of artificial neural network organizational and processing models, such as convolutional neural networks (CNN), deconvolutional neural networks, recurrent neural networks (RNN) optionally including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Alternatively or additionally, such machine learning systems may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may also be used to provide various services and/or applications, e.g., an image classify service, a user authentication service based on bio-information or biometric data, an advanced driver assistance system (ADAS) service, a voice assistant service, an automatic speech recognition (ASR) service, or the like, may be performed, executed or processed by electronic devices.

While the present disclosure has been particularly shown and described with reference to embodiments thereof, it will be understood by those of ordinary skill in the art that various changes in form and details may be made therein without departing from the spirit and scope of the present disclosure as defined by the appended claims. The presented embodiments should be considered in a descriptive sense only and not for purposes of limitation. For example, each element described as a single type may be distributed, and similarly, elements described to be distributed may be combined.

What is claimed is:

1. A memristor comprising:
a lower electrode and an upper electrode that are spaced apart from each other; and
a resistance change layer between the lower electrode and the upper electrode, the resistance change layer comprising a first two-dimensional material layer and a second two-dimensional material layer that are stacked on each other, and
wherein the resistance change layer has resistance characteristics that decrease as a number of sweeps of an applied positive electrical signal increases, and increases as a number of sweeps of an applied negative electrical signal increases.

2. The memristor of claim 1, wherein the resistance change layer includes defective grain boundaries.

3. The memristor of claim 2, wherein
the resistance change layer is configured to form a conductive filament on the defective grain boundaries in response to an application of an electrical signal to the lower electrode and the upper electrode.

4. The memristor of claim 2, wherein each of the first two-dimensional material layer and the second two-dimensional material layer includes line-type defects.

5. The memristor of claim 1, wherein the resistance change layer includes dot-type defects.

6. The memristor of claim 1, wherein the memristor is configured to operate with a set voltage in a range that is equal to or higher than 0.1 V and equal to or lower than 0.5 V.

7. The memristor of claim 1, wherein the memristor is configured to perform a bipolar resistive switching operation.

8. The memristor of claim 1, wherein, in the memristor after undergoing a forming operation,
an ohmic conduction slope of the memristor in a high resistance state is constant, and
an ohmic conduction slope of the memristor in a low resistance state is constant.

9. The memristor of claim 8, wherein the ohmic conduction slope of the memristor in the high resistance state, the low resistance state, or both the high resistance state and the low resistance state is in a range of 0.8 to 1.2.

10. The memristor of claim 1, wherein a distance between the lower electrode and the upper electrode is two to ten times a size of atoms in the resistance change layer.

11. The memristor of claim 1, wherein the first two-dimensional material layer and the second two-dimensional material layer include a same material.

12. The memristor of claim 1, wherein the first two-dimensional material layer and the second two-dimensional material layer have semiconductor characteristics.

13. The memristor of claim 1, wherein each of the first two-dimensional material layer and the second two-dimensional material layer is a single layer.

14. The memristor of claim 1, wherein at least one of the lower electrode and the upper electrode includes a metal.

15. The memristor of claim 1, wherein
the first two-dimensional material layer directly contacts the lower electrode and the second two-dimensional material layer, and
the second two-dimensional material layer directly contacts the upper electrode.

16. The memristor of claim 1, wherein
one of the lower electrode and the upper electrode includes an active electrode, and
an other of the lower electrode and the upper electrode includes a non-active electrode.

17. The memristor of claim 1, wherein the upper electrode, the first two-dimensional material layer, the second two-dimensional material layer, and the lower electrode are sequentially arranged to contact each other.

18. The memristor of claim 1, wherein
the upper electrode includes a plurality of first electrodes that are spaced apart from each other in a first direction perpendicular to a thickness direction of the resistance change layer,
the lower electrode includes a plurality of second electrodes that are spaced apart from each other in a second direction that is perpendicular to the thickness direction of the resistance change layer, and
the second direction is different than the first direction.

19. The memristor of claim 1, wherein
the lower electrode and the upper electrode include different materials from each other.

20. The memristor of claim 1, wherein
each of the first two-dimensional material layer and the second two-dimensional material layer include at least one of $MoS_2$, $WS_2$, $MoSe_2$, $WSe_2$, $MoTe_2$, $WTe_2$, $ZrS_2$, $ZrSe_2$, $HfS_2$, $HfSe_2$, GaSe, GaTe, InSe, $In_2Se_3$, $Bi_2Se_3$, and black phosphorus.

21. A device comprising:
the memristor according to claim 1, and
wherein the device is a neuromorphic device, memory device, or computing device.

* * * * *